United States Patent [19]

Hauck

[11] Patent Number: 4,849,928

[45] Date of Patent: Jul. 18, 1989

[54] LOGIC ARRAY PROGRAMMER

[76] Inventor: Lane T. Hauck, 5346 Bragg St., San Diego, Calif. 92122

[21] Appl. No.: 8,280

[22] Filed: Jan. 28, 1987

[51] Int. Cl.[4] .............................................. G06F 15/60
[52] U.S. Cl. .................... 364/900; 364/489; 364/929.1; 364/949
[58] Field of Search ... 364/200 MS File, 900 MS File, 364/716, 488, 489, 490, 491; 307/465; 365/94

[56] References Cited

U.S. PATENT DOCUMENTS

| | | | |
|---|---|---|---|
| 3,763,313 | 10/1973 | Doslik | 364/900 |
| 4,020,469 | 4/1977 | Manning | 340/172.5 |
| 4,433,384 | 2/1984 | Berrian et al. | 364/525 |
| 4,584,653 | 4/1986 | Chih et al. | 364/491 |
| 4,636,965 | 1/1987 | Smith et al. | 364/491 |
| 4,651,284 | 3/1987 | Watanabe et al. | 364/491 |

*Primary Examiner*—Eddie P. Chan
*Assistant Examiner*—Kevin A. Kriess
*Attorney, Agent, or Firm*—Bernard L. Kleinke; Jerry R. Potts; William Patrick Waters

[57] ABSTRACT

This logic array programmer which comprises a random access memory for storing a library of programmable array logic JEDEC files, including given device codes. The programmer also includes a permanent memory for storing a device code conversion table, for matching a device code to a different generic device. The programmer further comprises a conversion device for converting the programmable array logic JEDEC file into a generic array logic JEDEC file, and to program a generic array logic device therewith.

20 Claims, 10 Drawing Sheets

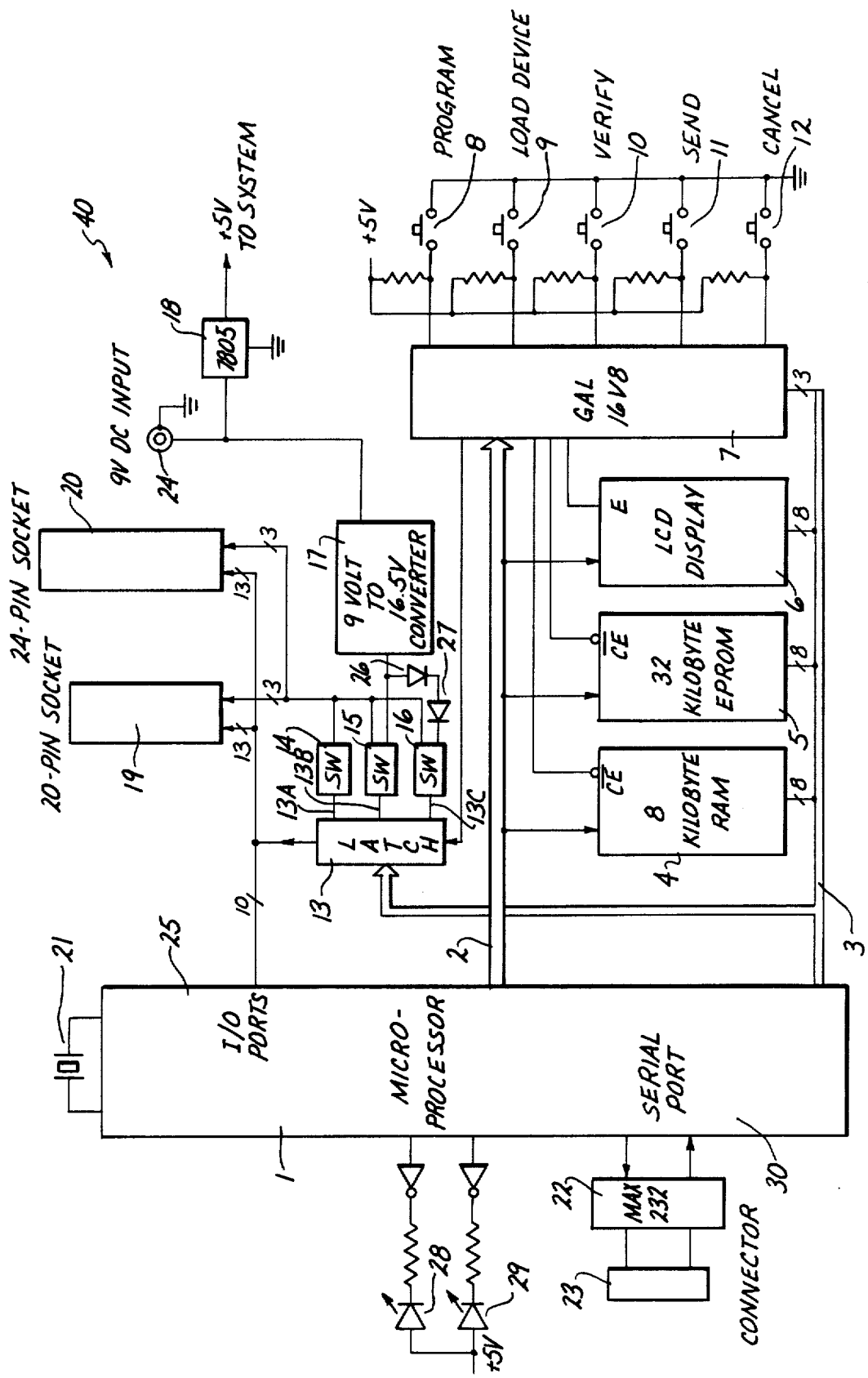

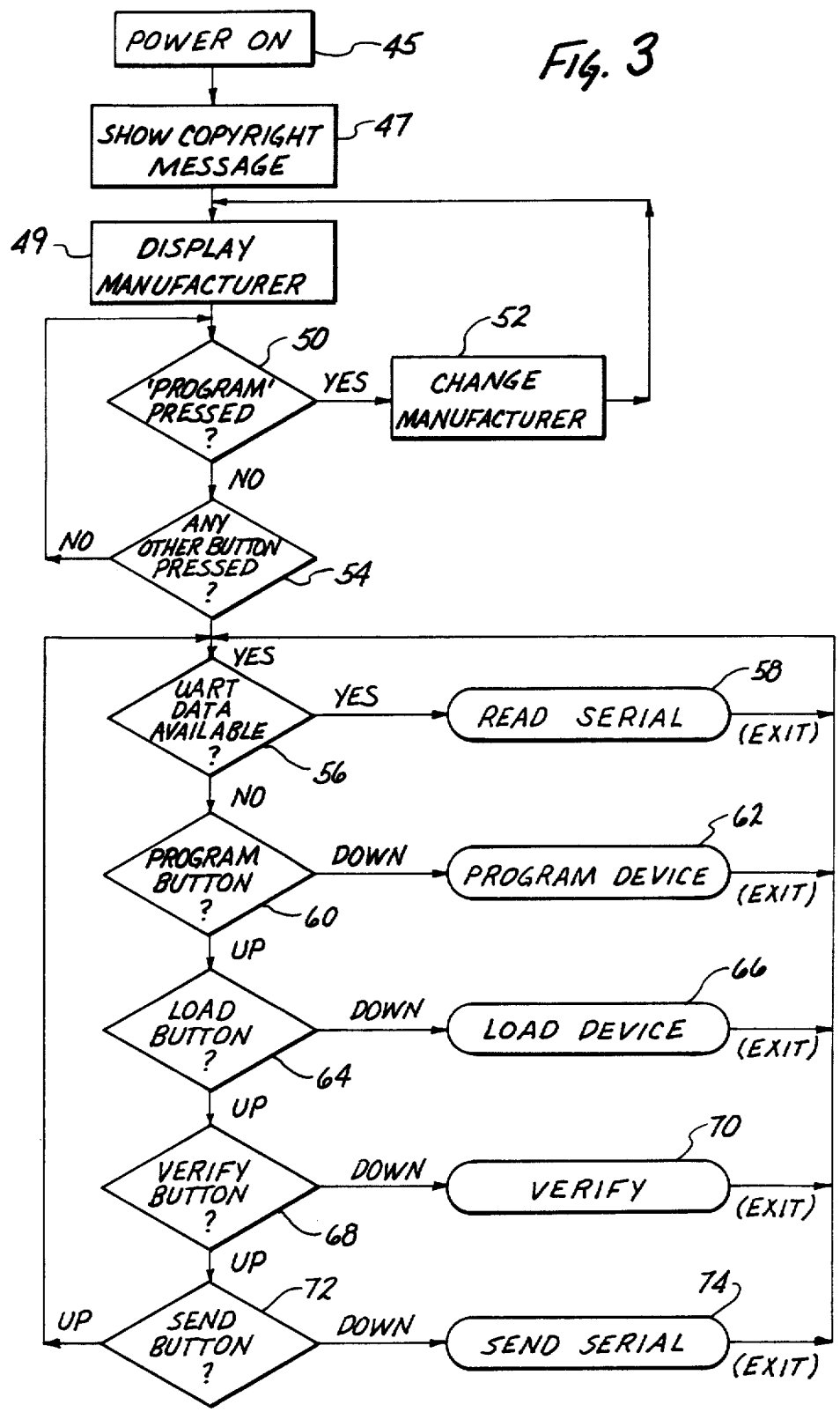

LOGIC ARRAY PROGRAMMER

DESCRIPTION

TECHNICAL FIELD

The present invention relates in general to logic array programmers, and it more particularly relates to a new and improved logic array programmer which is capable of identifying a programmable array logic device, as well as programming a generic array logic device.

BACKGROUND ART

Two types of array logic devices are presently commonly available on the market. The first and oldest device is the programmable array logic device. The second and more recent device, is the generic array logic device.

Programmable array logic devices provide a technique for design logic circuitry as well as for use in the manufacture of computers. However, they are very costly to produce, they have a high power consumption, and there is no uniformity among the enormous different types of devices presently on the market.

The generic array logic devices provide a great improvement over the programmable array logic devices. The generic array logic devices have similar logic configurations as the programmable array logic devices, but they present the several advantages thereover. One of the major advantages of the generic array logic devices is that they can be re-used and reprogrammed. The generic array logic devices use the CMOS technology, and therefore they have a lower power consumption. The generic array logic devices generally have a generic structure, thus enabling two generic array logic devices to duplicate about 44 different types of programmable array logic devices.

Both the programmable array logic devices and the generic array logic devices require programming equipment, generally known as programmers. The programmable array logic devices have been available for about ten years, and therefore the programmer support is quite extensive. There are at least a dozen programmable array logic programmer vendors. Due to the proliferation of programmable array logic device types, most programmers require some type of expensive adapter, so that the programmer can be retrofitted to handle new devices. Adapters are also required when the same device type (e.g., PAL16R4) from different manufacturers, have different programming specifications.

Newer programmable array logic programmers dispense with the use of adapters. They can be retrofitted to handle new devices by software upgrades. Programmable array logic programmers are very expensive, and generally cost thousands of dollars.

Programmable array logic programmers require device codes. To program a programmable array logic device, the operator first manually consults a chart that gives a device code for each of the programmable array logic types by manufacturer. The device code is entered into the programmer, usually by keying it into a front panel keyboard. This operation must be done before the programmer can do anything with a programmable array logic device.

Generic array logic devices are presently programmed with special adapters for existing programmable array logic programmers.

The only generic array logic programmer on the market is sold under the trade name Logic Lab from Programmable Logic Technologies. This unit consists of a programming box with a serial port. It requires connection to an IBM PC personal computer, or the like, for operation. The preliminary data sheet lists the supported devices as the GAL16V8, GAL20V8, ispGAL16Z8, ispGAL20Z8, and GAL39V18. The first two devices are the original generic array logic devices. The third and fourth devices are in system programmable versions (ISP). The GAL39V18 device is an advanced and yet unavailable generic array logic device.

It would therefore be desirable to have a logic array programmer which is capable of identifying the type of the programmable array logic device, without resorting to the manual identification of device code. The programmer should also be capable of programming a generic array logic device, using design file information derived from a programmable array logic JEDEC design file. A JEDEC file is defined as a map of all the fuses in the programmable array logic device, or of all the cells in the generic array logic device. JEDEC design files are the final result of logic compiler programs that allow the designer to enter logic designs in symbolic form, and then reduce these equations to the proper JEDEC file formats. The programmer should be capable of reading the generic array logic design file information, and programming a generic array logic device with such file information.

The programmer should also be very simple to use, and relatively inexpensive to manufacture. The programmer should be capable of displaying test vector information, and it should further indicate an error or mismatch in the test vectors. The programmer should enable the addition of unique identification information to the JEDEC file to be identified, or copied. The programmer should also be capable of transferring this unique identification information to the generic array logic device to be programmed. The programmer should display this unique identification information.

DISCLOSURE OF INVENTION

Therefore, it is the principal object of the present invention to provide a new and improved logic array programmer which is capable of identifying a programmable array logic device, and programming a generic array logic device.

Another object of the present invention is to provide such a new and improved logic array programmer which eliminates the need for device codes.

It is yet another object of the present invention to include and display test vectors information, and to indicate any error or mismatch therein.

Briefly, the above and further objects and features of the present invention are realized by providing a logic array programmer. This logic array programmer comprises a random access memory for storing programmable array logic JEDEC files, and device fuse information. The programmer also includes a permanent memory for storing a device code conversion table, for matching a device code to a different generic device. The programmer further comprises a conversion device for converting the programmable array logic JEDEC file into a generic array logic JEDEC file, and to program a generic array logic device therewith.

The logic array programmer of the present invention eliminates the need for the manual determination of device codes for a logic array programmer. There are two manners of loading the programmer with programming information. Firstly, a design file can be downloaded, usually from an IBM PC personal computer or similar computer, into the inventive programmer. This is accomplished by using a built-in serial port. The format of such a file has a JEDEC standard specification. For this reason the design file is usually referred to as a "JEDEC file".

The second approach for loading programming information into the programmer, is to insert a programmed generic array logic device into one of the programming sockets, and read the pattern of the device directly into the programmer.

In both of these cases, the user is not required to first look up and enter the device code for the device to be loaded. The inventive logic array programmer avoids this step entirely.

For a loaded JEDEC file, the logic array programmer retrieves the device type from a file header, which includes descriptive information about the JEDEC file. The three major logic compilers, ABEL, CUPL and PALASM, include the programmable array logic device type in the header. If it is not included in the header, the user inserts it by editing the JEDEC file with a standard word processor. For a loaded device pattern, the logic array programmer identifies the device type by inspecting all the device fuses.

Unlike most conventional programmers which require the operator to set up the programmer for transferring serial data from a host computer to the programmer, the inventive logic array programmer continuously monitors its internal serial port as if it were a front panel keyboard. As soon as an activity is detected on the serial port, the programmer switches to the "read serial" mode and reads in the JEDEC file.

Because conventional programmable array logic devices have been around for ten years, there are many existing JEDEC files for these devices. The inventive programmer accepts existing programmable array logic JEDEC files without alteration, and automatically maps the programmable array logic design into the generic array logic device.

The inventive logic array programmer updates existing programmable array logic JEDEC files to take advantage of new generic array logic features, without altering the function of the original file. In this regard, the generic array logic device contains unique identity information, called a UES, which stands for user electronic signature. Sixty-four programmable cells (8 bytes) in the generic array logic device are designated for the sole purpose of storing an eight character message. This message can be anything the user desires.

These 64 programmable cells are assigned "fuse addresses" in the JEDEC file. Since no programmable array logic devices exist that contain a UES, the new 64 UES "fuses" cannot exist in a programmable array logic JEDEC file, in that they are not defined for the programmable array logic devices. This means that any programmer that allows a user to load an existing programmable array logic JEDEC file cannot take advantage of the UES feature.

The inventive logic array programmer solves this problem. Instead of entering the UES as fuse information, the programmer searches in the JEDEC file header for a specially formatted text string. Specifically, it looks for an eight ASCII character message enclosed in quotes. Messages with fewer than eight characters are padded with spaces out to eight characters.

Thus, a user can edit an existing programmable array logic JEDEC file with a standard word processor to add the UES to the file design. The result is a generic array logic device which is programmed to operate like a programmable array logic device, with the additional UES feature, and an unaltered fusemap.

Since no fuses are changed, the edited file can still be used to program the programmable array logic device from which it originated. Although the quotation mark format is implemented in the logic array programmer, any special format that the user can add with a word-processor, and which the programmer is set to recognize, can be used to add nonstandard (non-fuse) information to a JEDEC file.

Conventional logic compilers allow the user to append test vectors to the JEDEC design file. The test vectors specify input signals to be applied to the device, and output signals to be tested after the input signals have been applied. The test vectors are run on the device after programming. They test the functionality of the device beyond the normal fuse verification done after programming.

When a test vector error is encountered by the logic array programmer, the actual vector from the JEDEC file is displayed, with the bad outpu signal highlighted. At this point, the user can continue testing vectors, or alternatively terminate the operation. This inventive feature adds to the overall convenient use of the logic array programmer. In fact, when conventional equipment is used, a test vector error is indicated very cryptically by an indication, such as "Error 39", and thus the operator must consult the instruction manual to determine the meaning of the message to learn that it represents a test vector error. The inventive logic array programmer dispenses entirely with such a requirement for a manual look-up operation.

BRIEF DESCRIPTION OF DRAWINGS

The above mentioned and other objects and features of this invention and the manner of attaining them will become apparent, and the invention itself will be best understood by reference to the following description of an embodiment of the invention in conjunction with the accompany drawings, wherein:

FIG. 1 is a block diagram of the logic array programmer, which is constructed according to the present invention;

FIG. 3 is a flowchart of computer software programs stored in the logic array programmer of FIG. 1 to control its operation.

BEST MODE FOR CARRYING OUT THE INVENTION

Figure 2A:
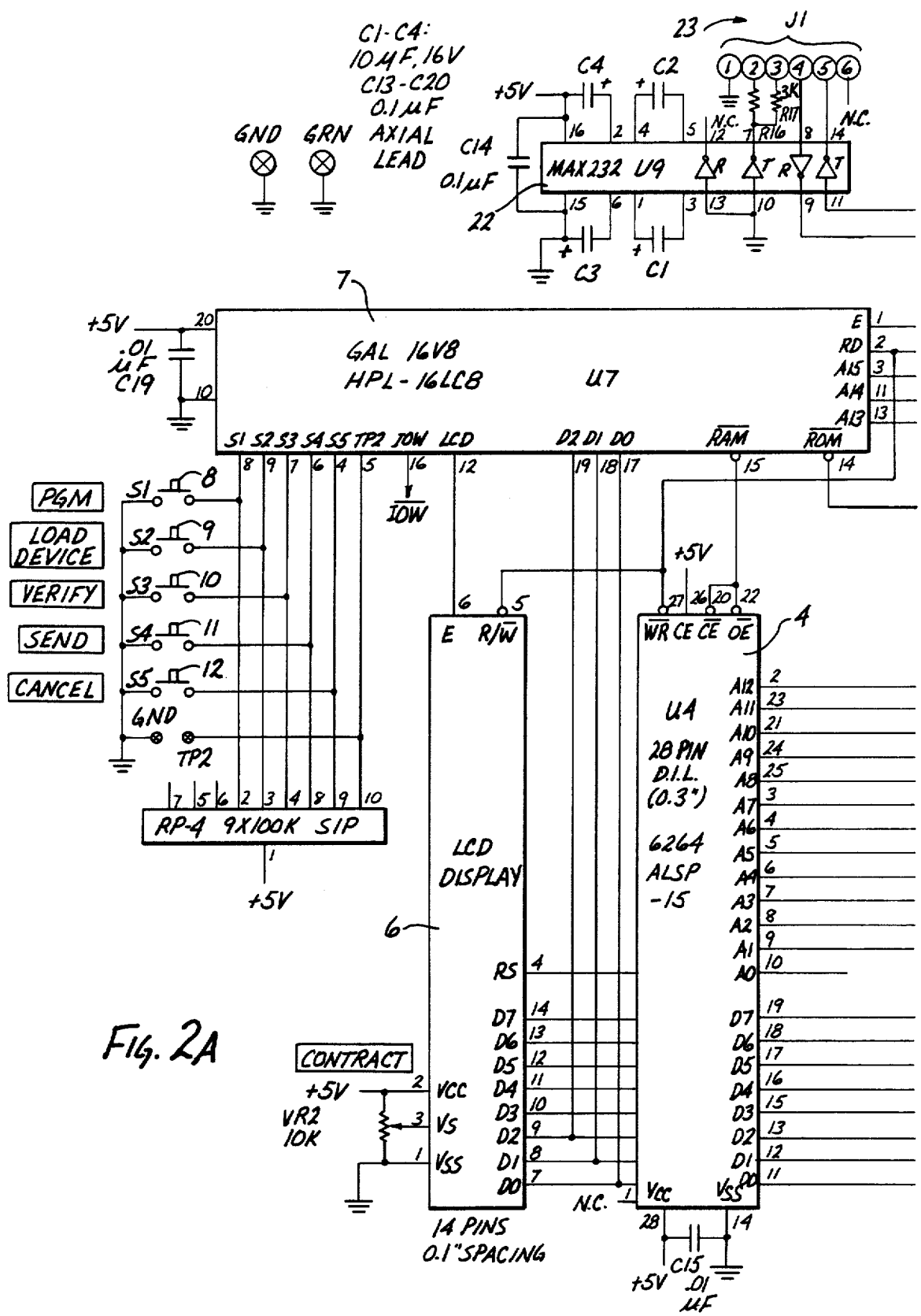
FIGS. 2A–2C form a detailed circuit diagram of the logic array programmer. of FIG. 1.

Referring now to FIG. 1 of the drawings, there is shown a logic array programmer 40 which is constructed in accordance with the present invention. The programmer 40 is adapted to program generic array logic devices (not shown), which may be inserted into either a 20-pin socket 19, or a 24-pin socket 20.

The logic array programmer 40 generally comprises a microprocessor 1, for executing computer programs stored in the logic array programmer 40, and illustrated in FIGS. 3–8.

The microprocessor 1 is a Hitachi HD63A03Y CMOS Microprocessor, described in Hitachi Data Sheet #U167, January, 1986. It is available from Hitachi America, San Jose, Calif. For the purpose of storing JEDEC format files as received from a remote computer (not shown), and in order to store the contents of a generic array logic device, and for storing the final pattern of cells to be programmed into a generic array logic device, a random access memory 4 is connected to the microprocessor 1, by an address bus 2, and a data bus 3. The memory 4 is a CMOS static random access memory manufactured by Hitachi. The Hitachi part number is HM65256AP-20, and is described on pages 173–179 of the Hitachi *IC Memories Data Book*, September 1985 edition.

For the purpose of storing the computer software illustrated in FIGS. 3–8 to be used in conjunction with, and to be executed by the microprocessor 1, an eraseable programmable read only memory 5 is connected to the microprocessor 1 by the address bus 2 and the data bus 3. The memory 5 is a CMOS EPROM manufactured by Hitachi. The Hitachi part number is HN27C256G-30, and is described on pages 303–306 of the *Hitachi IC Memories Data Book*, September 1985 edition.

A liquid crystal display device 6 is also connected between the address bus 2 and the data bus 3 of the microprocessor 1, to provide an alphanumeric visual interface between the operator and the logic array programmer 40, regarding the operation of the logic array programmer 40. The LCD display 6 is a Hitachi LM032L or equivalent, described on pages 74–76 and 23–30 of the Hitachi data book, *Hitachi Dot Matrix Liquid Display*. It presents alphanumeric data on a two line display, each line containing 20 characters.

In order to provide a chip decoder and an input port, a generic array logic 7 is suitably programmed and is connected to the microprocessor 1 by the address bus 2 and the data bus 3. The generic array logic 7 is a GAL20V8 generic array logic device manufactured by Lattice Semiconductor Corp. of Beaverton, Ore., or VLSI Technology Inc. of San Jose, Calif. Logic equations for the generic array logic 7, completely describes its function. These equations are part of a source file for the compiler sold under the trade name ABEL, and which is available from Data I/O Corporation of Redmond, Wash. The following is a Table A which is the source file for logic device 7:

TABLE A

```
module GPR
title 'GPR-1000 Decoder
"GPR-Sels"
Lane Hauck'
 gpr      device    'P16L8';
S1,S2,S3,S4,S5,TP2          pin 8,9,7,6,4,5;
E,RD,A15,A14,A13            pin 1,2,3,11,13;
LCD,ROM,RAM,D0,D1,D2,IOW    pin 12,14,15,17,18,19,16;
"Constants
HI,LO     = 1,0;
Ck,X,Z,P  = .C.,.X.,.Z.,.P.;
equations
Enable D0 = RD & E & !A15 & A14;
Enable D1 = RD & E & !A15 & A14;
Enable D2 = RD & E & !A15 & A14;
!ROM = ((A15 & A14) # (A15 & !A14 & A13)) & RD & E;
LCD = E & A15 & !A14 & !A13;
!IOW = !A15 & A14 & !RD & E;
!RAM = !A15 & !A14 & A13 & E;
!D2 = !S3 & !A13 # !TP2 & A13;
!D1 = !S4 & !A13 # !S1 & A13;
!D0 = !S5 & !A13 # !S2 & A13;
end GPR
```

For the purpose of initiatinq the software for the logic array programmer 40, five switches 8–12 are connected to the input ports of the generic array logic 7, and read into the microprocessor 1 via a three bit data bus. In order to provide additional output signals for the microprocessor 1, a latch 13 is connected to the data bus 3. The latch 13 is a 74HC273 chip, and is available from Hitachi.

The sockets 19 and 20, are connected to the input-/output signal lines 13A, 13B and 13C, or I/O ports 25 of the microprocessor 1, to receive different generic array logic devices to be loaded and programmed with the logic array programmer 40. The input/output signal lines 13A, 13B and 13C are used to read and program the logic array devices in sockets 19 and 20. These input/output signal lines are all at CMOS logic levels of 0 volts for logic 0, and 5 volts for logic 1.

A crystal 21 is connected to the microprocessor 1 to set the internal clock frequency thereof. A 4.9132 Megahertz crystal 21 is used for the internal serial port 30 of the microprocessor 1, to operate at 9600 baud.

An integrated circuit 22 converts the TTL level serial signals from microprocessor 1 to RS-232 standard levels, and interfaces with a remote computer (not shown) through a connector 23. The integrated circuit 22 is a MAX-232, available from Maxim Integrated Products Inc., Sunnyvale, Calif.

GENERAL OPERATION DESCRIPTION

In use, the first phase of the operation of the logic array programmer 40 comprises setting up the logic array programmer 40 for receiving either a Lattice or VLSI Technology Inc. generic array logic. The set up is accomplished by turning the logic array programmer 40 on, and then the user presses the program button 8, to toggle between the two manufacturers. The CANCEL button 12 is pressed when the desired manufacturer is indicated on the LCD display 6. Once a manufacturer is selected, the logic array programmer must be turned off and on again to change modes.

In order to identify a programmed generic array logic device (not shown), it is first plugged into the corresponding socket 19 or 20 depending on the number of pins on the generic array logic device to be programmed. The LOAD DEVICE switch 9 is then depressed to load the fuse pattern of the generic array logic to be identified, into the memory 4. The LCD display 6, illustrates the relevant information regarding the generic array logic device.

If in the alternative, a JEDEC file is to be loaded into the logic array programmer 40, the serial port 30 of the microprocessor 1 is connected to a remote computer (not shown), via the integrated circuit 22 at the connector 23. A compatible remote computer is the IBM PC equipped with a 9600 baud serial port or equivalent. The instruction MODE COM1:96,n,8,1 is then entered into the remote computer, and the file is then transferred to the microprocessor 1. This transmission of the file is accomplished by entering the instruction: COPY FILE.JED COM1.

When two generic array logic devices are to be compared, a first genric array logic device is plugged into either socket 19 or 20, and the LOAD DEVICE button is depressed. This loads the first device fuse patter into memory 4. The first generic array logic device is then removed, and a second generic array logic device is inserted in the same socket as the first generic array logic device. The VERIFY button is then depressed and held down. The LCD display 6 then displays the check sums for the second generic array lgic device and for the memory 4.

In order to program a generic array logic device, from either an already programmed generic array logic device or from a JEDEC file, the fuse pattern is first loaded into the memory 4, as previously explained. After the fuse pattern is loaded in the memory 4, which causes either of the sockets 19 or 20 to become illuminated, the generic array logic device to be programmed is then inserted in the illuminated corresponding socket 19 and 20, and the PROGRAM switch is then depressed twice. Whenever the LOAD DEVICE switch is depressed, or whenever a JEDEC file is loaded over the serial port 30 of the microprocessor 1, the memory 4 is loaded with a new corresponding fuse pattern. Such fuse pattern becomes the "reference" pattern for subsequent PROGRAMMING and VERIFY operations.

Figure 2B:
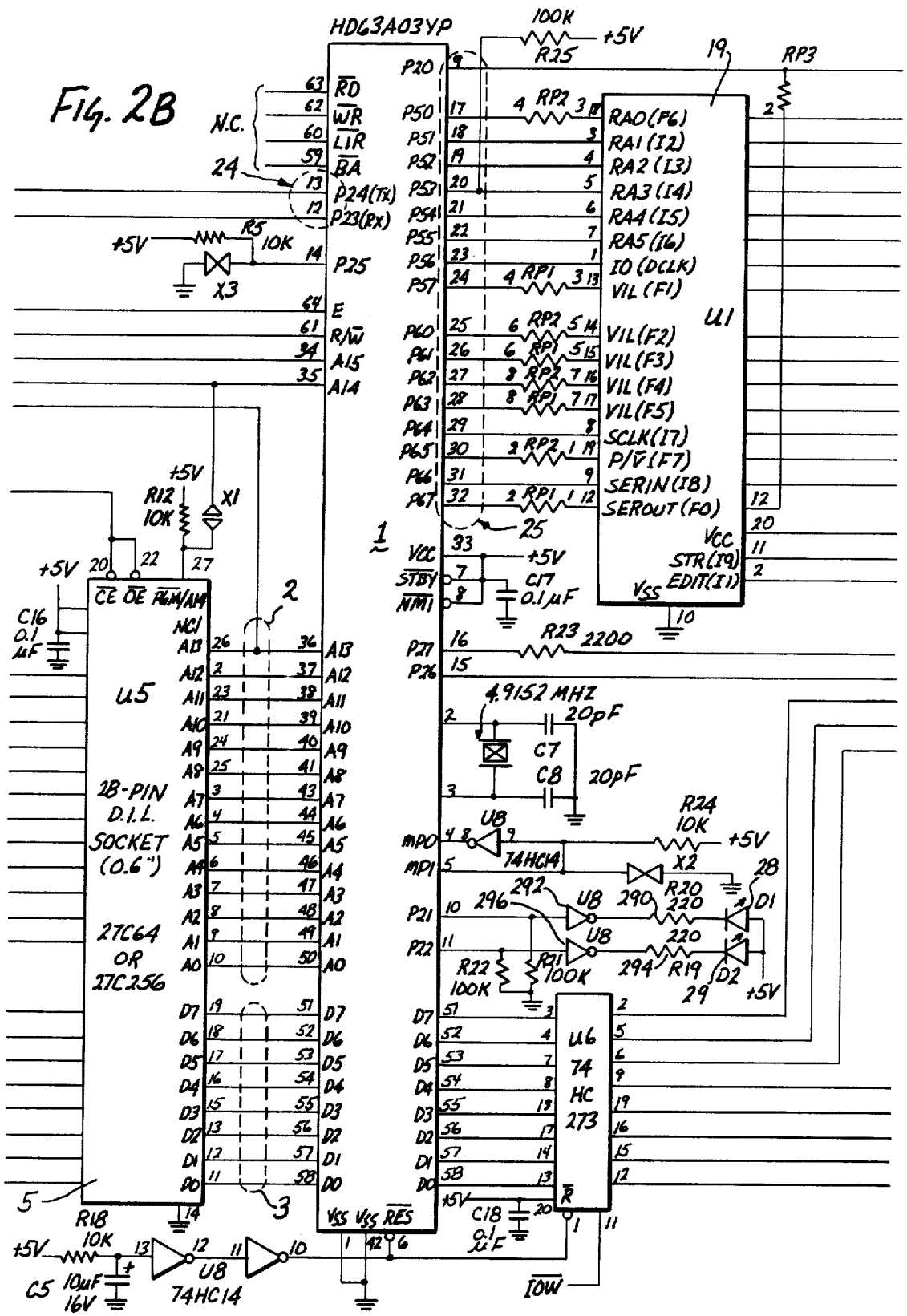
Figure 2C:
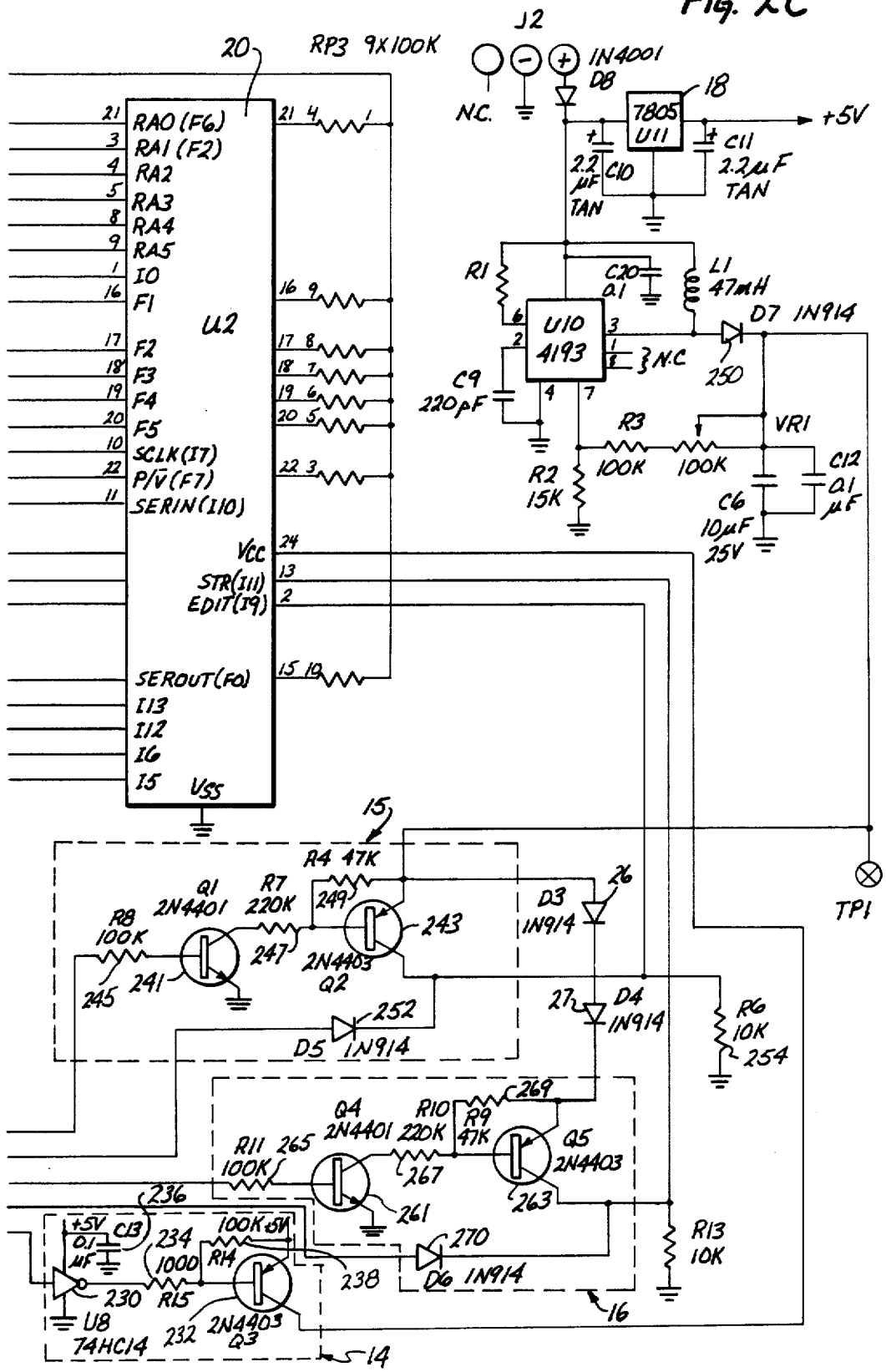

Referring now to FIG. 2 of the drawings, the logic array programmer 40 is described in greater detail. The circuit diagram illustrates all of the various pin connections and components of the logic array programmer 40.

Three transistor switches 14-16 control the voltages at the test socket power and high voltage pins. The transistor switch 15 supplies 0 volts or 5 volts power to the generic array logic device to be read or reprogrammed. The transistor switch 14 generally comprises an inverter 230 and a transistor 232. The inverter 230 has its input connected to pin 12 of the latch chip 13, and its output connected to the base of the transistor 232 via a resistor 234. A resistor 238 is connected between the base and the emitter of the transistor 232. The collector of the transistor 232 is connected to pin 24 of the 24-pin socket 20, and to pin 20 of the 20-pin socket 19.

Considering now the transistor switch 15, it supplies 0 volt, 5 volts or 16.5 volts to the EDIT pin 2 of the generic array logi device (not shown) to be read or programmed. The 16.5 volts is used only for reading or writing on the generic array logic device. The transistor switch 15 comprises a transistor at 241 and another transistor 243. A resistor 245 is connected between the pin 9 of the latch 13 and the base of the transistor 241. A resistor 247 is connected between the collector of the transistor 241 and the base of the transistor 243. A resistor 249 is connected between the base and emitter of the transistor 243. The emitter of the transistor 243 is connected to a pair of diodes 26 and 27, and through another diode 250, to the pin 3 f the switching regulator circuit 17. A suitably-poled diode 252 is connected between the pin 19 of the latch chip 13 and the collector of the transistor 243. A resistor 254 is connected between the collector of the transistor 243 and ground potential. The collector of the transistor 243 is also connected to the EDIT pins 2, of the sockets 19 and 20.

Considering now the transistor switch 16 in greater detail, it supplies 0 volt, 5 volts or 15 volts to the PRELOAD pin of the generic array logic device to be read or programmed. The 15 volts is used only to preload the generic array logic output registers. The transistor switch 16 generally comprises a transistor 261 and another transistor 263. A resistor 265 is connected between the pin 16 of the latch 13, and the base of the transistor 261. A resistor 267 is connected between the collector of the transistor 261 and the base of the transistor 263. The resistor 269 is connected between the base and the emitter of the transistor 263, and to the output terminal of the diode 27.

The emitter of the transistor 261 is connected to ground potential. A suitably-poled diode 270 is connected between the pin 15 of the latch 13, and the collector of the transistor 263. Resistor 272 is connected between the collector of the transistor 263 and ground potential. The collector of the transistor 263 is connected to pin 13 of the 24-pin socket 20 and to pin 11 of the 20-pin socket 19.

The input/output signal lines 13A, 13B and 13C, and the I/O PORTS 25 of the microprocessor 1 are at CMOS logic levels of 0 volt for logic 0, and 5 volts for logic 1. The 5 volt power is derived from the 9 volt DC input voltage from the connector 23, by using the regulator 18.

In addition to the logic levels, the generic array logic device requires a 16.5 volt signal for the EDIT pin, and a 15 volt signal for the PRELOAD pin. The 16.5 volt signal is produced by the switching regulator circuit 17, built from an integrated circuit type RC4193, available from Raytheon Company, Mountain View, Calif., and described in the Raytheon publication, *RC4193/4391 Switching Regulator Application Notes*, 2/85. This circuit boosts the 9 volt input voltage to 16.5 volts.

The 15 volt signal is produced by connecting the signal diodes 26 and 27 in series with the 16.5 volt level.

Two light emitting diodes 28 and 29 are connected to two microprocessor 1 output pins 10 and 11 respectively through inverters 292 and 296. The light emitting diodes 28 and 29 are used to tell the user which socket 19 or 20 to use. The light emitting diode 28 is connected to the pin 10 of the microprocessor 1 through a resistor 290, and an inverter 292. The light emitting diode 29 is connected to the pin 11 of the microprocessor 1 through a resistor 294 and an inverter 296.

DETAILED OPERATION DESCRIPTION

How To Select a Manufacturer:

When the logic array programmer is turned on, the operator will briefly see the following message is displayed on the LCD display 6:

Testing the RAM. . .

Followed by:

Ver x.x Qwerty Inc.

COPYRIGHT 1987

After about two seconds, the display changes to this:

Press PGM to select:

----- Lattice ----- or

Press PGM to select:

---- VLSI Tech ----

Pressing the PROGRAM switch cycles the bottom display line between the current two manufacturers of generic devices. When the desired manufacturer has been selected, the operator then depresses any of the other four switches. For example, if the CANCEL switch 12 is pressed, the following is displayed:

Ready when you are. .

[manufacturer]

The logic array programmer 40 is now ready to accept the fuse pattern information from one of two sources, a generic array logic device (GAL16V8 or GAL20V8) or the serial port 30.

To load a generic array logic device pattern into the internal memory 4 of the logic array programmer 40, a programmed generic arryy logic device is first inserted into the appropriate socket 19 or 20, and the LOAD DEVICE switch 9 is then depressed. A light emitting diode 28 or 29 disposed next to the corresponding socket 19 or 20, illuminates as a reminder that the fuse pattern in the memory 4 corresponds to either a 20-pin generic array logic device, or 24-pin generic array logic device.

The message, "READING DEVICE" now appears on the LCD display 6 for about one second. During this time, the generic array logic fuse pattern is read into logic array programmer memory 4. When the loading is complete, the display 6 shows two lines of device information:

| 14L8 P$3D15 | G$C689 |
|---|---|
| "MyGalUES" | PC=03 |

For this example, the GAL20V8 generic array logic device (not shown) has been programmed from a PAL14L8 JEDEC file for a programmable array logic device (not shown), indicated by the "14L8". Two checksums are shown, P$ (PAL) and G$ (Generic). The P$ checksum should match the fuse checksum in the PAL14L8 JEDEC file.

The G$ checksum incorporates all the generic array logic fuses, including those outside the logic array that configure the generic array logic for different programmable array logic architectures.

The 8 character string shown between the quotes is the UES (User Electronic Signature). This can be any ASCII string, which is stored in the memory 4.

The "PC" stands for "Program Cycles" and shows how many times the generic array logic device has been erased and reprogrammed. In the Lattice mode, if the number is greater than 100, the display shows the following message: "PC>100". In the VLSI Tech mode, if the number is greater than 100, the displayed message is "EPC=nnnn". The "EPC" is an extended program cycle count, and is available only with VLSI Technology parts. This number counts to 9999. All program cycles above 9999 are displayed as 9999. Thus, at this stage, a new "Master" pattern for programming other generic array logic devices is stored in the internal memory 4 of the logic array programmer 40. In order to load a JEDEC File From a personal computer (not shown), a simple JEDEC file, produced by the ABEL Logic Compiler, and is as shown in the following table:

| JEDEC FILE |
|---|
| [stx]ABEL(tm) Version 1.13 JEDEC file for: P10L8 |
| Created on: 01-May-86 09:24 PM |
| Architecture Test Pattern |

| -continued |
|---|
| JEDEC FILE |
| Lane Hauck* |
| QP20* QF320* |
| L0000 |
| 1011111111111111101 |
| 0000000000000000000 |
| 1101111111111111111 |
| 1111111111111111101 |
| 1111101111111110111 |
| 0000000000000000000 |
| 1111110111111111111 |
| 1111111111111110111 |
| 1111111101111111011 |
| 0000000000000000000 |
| 1111111110111111111 |
| 1111111111111111011 |
| 1111111111111111101 |
| 1111111111101111111 |
| 1111111111111011111 |
| 0000000000000000000* |
| C1AF8* |
| [etx]689D |

The "[stx]" and "[etx]" are non-printing ASCII characters for "start transmission" (ASCII 02) and "end transmission" (ASCII 03). The "header" is defined as all characters between the [stx] and the first asterisk. Anything which is inserted into the header does not affect the logic design.

The "QP20" in the example file indicates a 20-pin device, and the "QF320" indicates that the device has 320 fuses. These fields are not used by the logic array programmer. The "L0000" is a fuse address. The ones and zeros following this address correspond to fuse states, with fuse addresses incrementing for every fuse.

The "C1AF8" after the fuses represents a fuse checksum, which is used to verify that all the fuse data was received by the programmer without error. The four-digit hexadecimal number after the [etx] is a transmission checksum. It is not used by the logic array programmer 40. Before the logic array programmer 40 can accept this design file, the PC serial port must be properly configured.

How To Set Up The Serial Port

The serial port theory of the logic array programmer 40 is set to accept following parameters: 9600 baud, No parity, 8 data bits, and 1 stop bit.

If an IBM PC personal computer or equivalent is being used, the serial port for this format is set up by typing the following (from DOS):

MODE COM1:96,N,8,1

This instruction assumes that the serial port is designated as "com1:". The serial port could alternatively be designated as "com2:".

The logic array programmer 40 treats the serial port input theory as a "sixth switch" on the front panel. In this regard, the microprocessor 1 and the generic array logic device scan the five switches, 8–12, and they also check the serial port for activity. This eliminates the need for any setup operation prior to receiving serial data. If the serial port is configured incorrectly, for example if it is set for 4800 baud, the following message appears on the LCD display 6:

Serial Receive ERROR

9600 Bd,NP,8-bit,lsb

The bottom line reminds the operator of the correct setting.

Since the serial port is being continuously scanned, the operator might see the above error message when a "glitch" occurs at the sending end, for example when the host or remote computer is turned on or off. To clear the error indication, simply press the CANCEL switch 12.

The logic array programmer 40 serial port is permanently set for the following mode:

9600 baud. No parity. 8 data bits. 1 stop bit. Two interface cables are supplied with the logic array programmer 40. One has a 5 pin DIN connector at the logic array programmer 40 end, and a DB-9 connector at the IBM PC end.

The DB-9 connector is compatible with the serial port connector on the IBM PC AT serial adapter card, as well as with many multifunction cards for the PC/clone family. The other cable has a 5 pin DIN connector at the logic array programmer 40 end, and a DB-25 connector at the IBM PC end. This supports the original IBM "Asynchronous Adapter" card, as well as many standalone serial interface cards.

The DSR and CTS signals are.supplied from a +12 volt supply through 3 kilohm resistors. There is no "handshake" for either direction. DSR and CTS are asserted to allow use of the MSDOS "copy" command to transfer files from the PC to the logic array programmer 40.

For the purpose of sending data from the personal computer, to the RAM memory 4, the operator can send the file from the remote computer to the logic array programmer 40, by issuing the following instruction in the remote computer:

copy file.jed com1

This tells DOS to copy the file "file.jed" from disk to the com1 serial port. When serial data transfer starts into the logic array programmer 40, the display 6 shows the following message:

...RECEIVING DATA...

**********<(etc)

A moving pattern of asterisks shows the data flowing into the logic array programmer 40. Whenever an asterisk is added or removed, 50 bytes of data have been received. Thus, each "pass" of asterisks across the display 6 indicates that 1000 bytes have been received. When the file finishes loading, one of the two socket light emitting diodes 28 or 29 will be illuminated, and the display will show something like the following message:

| 10L8 | P$1AF8 | G$AD40 |
|------|--------|--------|
| "    | "      |        |

The logic array programmer 40 finds the "10L8" in the JEDEC file header, and from this displays the programmable array logic device type, and turns on the proper socket light 28 or 29. The P$ and G$ checksums are the same ones illustrated in the LOAD DEVICE operation. In this example, the JEDEC file did not contain a UES. Thus the characters in quotes are indicated by eight little hollow boxes.

Extensive error checking is performed by the logic array programmer 40 before this display is shown. For the JEDEC file example shown above, the fuses for the PAL10L8 are transformed into the generic GAL16V8 array map, and then written into the internal RAM 4 to serve as a template for programming generic array logic devices.

The P$ checksum is then computed from the RAM 4 data, and compared with the checksum contained in the JEDEC file. This checks the data received over the serial port, the generic array logic architecture mapping, and the RAM 4 for every loaded JEDEC file. Let us suppose that the serial port dropped a character or turned a "0" into a "Z". Then the message displayed will be as follows:

Fuse Checksum ERROR.

Jed:$abcd RAM:$efgh

"Jed:" is the checksum represented in the JEDEC file as "Cnnnn". For example, the example JEDEC file on page 5 has a fuse checksum of 1AF8 (hexidecimal). "RAM" is the checksum computed from the ones and zeros in the JEDEC file as received over the serial port and stored in the RAM 4. If this message appears, the operator should try to repeating the loading operation. If the error persists, the operator should make sure that the JEDEC file has not been corrupted.

How To Program a Generic Array Logic Device:

Once an array pattern has been loaded into the RAM 4, the new generic array logic device is ready to be programmed. "New" shall mean a factory fresh generic array logic device, or a previously programmed one which needs to be erased and reprogrammed. One of the lights will be on to indicate which socket 19 or 20 to be used. The new generic array logic device is then plugged in the corresponding socket, and the lever (not shown), is flipped down. The PROGRAM switch 8 is then depressed, and the following message will appear:

---PROGRAM DEVICE---

Press PGM or CANCEL

Or, if the generic array logic device to be reprogrammed is internally marked as a "master" device (Lattice mode only), the following message will appear:

Device is a MASTER..

Press PGM or CANCEL

At this stage, the operator can bail out by depressing the CANCEL switch 12, in case the PROGRAM switch 8 was accidentally pressed, or he could forge ahead by depressing the PROGRAM switch 8 again. Pressing the PROGRAM switch 8 a second time displays the following message:

....PROGRAMMING....

If all goes well, the display changes to:

PROGRAMMED-VERIFIED!

Now the logic array programmer 40 checks the JEDEC file for the presence of test vectors which are optional in the JEDEC file. If there are none, the following message will appear:

PROGRAMMED-VERIFIED!

No test vectors

If the JEDEC file contains test vectors, each vector will appear in the bottom line of the display 6, as it is tested. These vectors move along at about 100 per second. If all vectors pass, the following message will appear:

PROGRAMMED-VERIFIED.

All Tst Vectors PASS

If an error is found in a test vector, the display 6 freezes on the bad vector and blinks the first output pin it found to be in error. The output pins are tested in ascending order: 12 to 19 for a 20-pin generic array logic device, 15 to 22 for a 24-pin generic array logic device.

If a test vector error is found, the operator can proceed in two ways:

1. Press the CANCEL switch 12 to stop testing vectors.
2. Press the VERIFY switch 10 to continue testing the vectors. If there are multiple vector errors, each press of the VERIFY sWitch 10 will cause the display of the next error.

Generic Array Logic Device Masters (Lattice Mode Only)

An internal flag in a Lattice generic array logic device is used to mark the device as a "master". Marking a device as a master simply tells the logic array programmer 40 to alert the user that this part has been previously designated a "master" when the part is about to be erased or reprogrammed. The master flag has absolutely no effect on the generic array logic device operation. It is there simply as a gentle reminder.

To mark a device as a master, the following steps should be followed:

1. Press the PROGRAM switch 8.
2. The visual display 6 instructs the operator to press either the PROGRAM switch 8, or the CANCEL switch 12.
3. To mark the flag device as a "master", press and hold down the LOAD DEVICE switch, and press the PROGRAM switch 8.
4. Release both switches. The following message appears on the LCD display 6:

PROGRAMMING (as a device Master)

The only effect this has is that when the operator later wishes to erase and re-program this device, the following message is displayed when PROGRAM switch 8 is depressed:

Device is a MASTER..

Press PGM or CANCEL

Performing the above operations in the VLSI Tech mode will have no effect. The VERIFY Operation The VERIFY operation can be used to:

1. Compare a programmed generic array logic device with another programmed generic array logic device.
2. Compare a programmed generic array logic device with a loaded JEDEC file resident in the RAM memory 4.
3. Test a programmed device with test vectors from a JEDEC file.
4. Find out the checksum ofa device without loading it into RAM memory 4, and thus serving as the "master" pattern for programming.

The VERIFY operation comprises two parts, a fuse verification and a test vector verification. When the VERIFY switch is pressed and held down, the following message appears briefly:

VERIFYING THE DEVICE

In order to verify the device in question, fuse checksums are computed for the fuse patterns in the memory 4 and for the inserted generic array logic device. These two checksums are then compared. If the checksums do not match, the following message appears, while the VERIFY switch is still being held down:

| Device | <<−X−>> | RAM |
|---|---|---|
| P$:0860 | | P$:1234 |

If generic array logic devioe parts are being compared, the "G$" designation appears in place of the "P$" designation. The two checksums correspond to the pattern in the generic array logic device ("Device") and the fuse pattern in the RAM memory ("RAM").

If the generic array logic device and the internal RAM memory 4 patterns match, the following message appears when the VERIFY switch 10 is pressed and held down:

| Device | +MATCHES+ | Ram |
|---|---|---|
| P$:40F1 | | P$:40F1 |

There are actually two "matches" messages. In some cases, the following messages might appear:

| Device | −matches− | Ram |
|---|---|---|
| G$40F1 | | G$:4095 |

The lower case "-matches-" message with the minus signs indicates a special VERIFY case. This happens when two generic array logic devices are being compared (indicated by the "G$" checksums), and everything but the UES's verify. In this special case, the G$ checksums are different. The generic array logic devices are shown to verify, since they are functionally identical. They differ only by the user information stored in the UES.

If available, test vectors are then executed when the VERIFY switch 10 is released, and the second part of the VERIFY operation takes place. If test vectors were loaded via a JEDEC file, they are applied to the generic array logic device. If there are no test vectors in the logic array programmer memory, the following message appears:

No test vectors

If test vectors are present in the loaded JEDEC file, they are run. Each test vector is shown in the display as it is tested. If all test vectors pass, the following message appears:

PROGRAMMED-VERIFIED!

All Tst Vectors PASS

If an error is found in a test vector, the display freezes on the bad vector and blinks the first output pin it found to be in error. The output pins are tested in ascending order: 12 to 19 for a 20-pin generic array logic device, 15 to 22 for a 24-pin generic array logic device.

If a test vector error is found, the operator can proceed in two ways:

1. Press the CANCEL switch 12 to stop testing vectors.
2. Press the VERIFY switch 10 to continue testing vectors. If there are multiple vector errors, each press of the VERIFY switch 10 will cause the display of the next error. The CANCEL switch 12 can be pressed at any time to set up another operation.

When a GAL16V8 or GAL20V8 generic array logic device is configured for one or more registered outputs, it is often very useful to apply test vectors to this generic array logic device that preset the output registers to known states. This register preload function is a standard feature of generic array logic devices. To activate the preload mechanism, the text vectors are defined with the following format:

V0001 PXXXXXXXXN011100101N* [apply presets]
V0002
0XXXXXXXXN0HHHLLHLHN* [test outputs]

These vectors are for a P16R8, with eight registered outputs. The test vectors are done in pairs. The first vector of each pair puts a "P" in the pin-1 position, this is normally the clock input, and it defines all inputs as "don't cares", and puts 1's and 0's in the output pin positions (pins 12-19).

In the JEDEC standard, 1's and 0's are used to drive pins, and H's and L's are used to test pins. The second vector of each pair sets the pin-1 input to 0 to make sure it is not clocked, and tests the output pins for the previous vector's preload values using H's and L's.

An important note about the test factors is that some logic compilers allow the operator to combine preload vector pairs into a single vector, and thus to apply the inputs and to test the outputs in a single vector. For example, ABEL can produce the following vector:
V0001 PXXXXXXXXN0HHHLLHLHN*

The above vector improperly instructs the application of H's L's to the preload outputs, and the testing of the outputs for the same values. This is a combination of the two vectors shown above.

This is not allowed in the JEDEC standard, and is not supported by the logic array programmer 40. If errors resulting from this form of preload vector are obtained, the design file should be re-edited and compiled so that the two vector-form is used.

Another important note about the vectors is that some logic compilers are quite sloppy in what they allow in test vector syntax. To be correct, the test vectors should obey the following rules, as specified in the JEDEC standard:

1. Pins to be driven with logic HI are shown as "1".
2. Pins to be driven with logic LO are shown as "0".
3. Pins that are not tested (such as Vcc and GND) are shown as "N".
4. Pins that are to be tested for logic HI are shown as "H".
5. Pins that are to be tested for logic LO are shown as "L".

When the logic array programmer 40 scans a test vector from the JEDEC file, it first looks for 1's and 0's and drives the generic array logic device pins accordingly. It then scans the test vector for H's and L's and tests pins accordingly. If an "H" or "L" is not found, the pin is not tested. A common mistake if the operator is building his own vectors as with PALASM, is to put 1's and 0's everywhere--in the "driving" positions and the "testing" positions, like this:
V0002 100101110NX1oo11000N*

This vector should be expressed as:
V0003 100101110NXHLLLHHLLN*

Vector "V0002" will always pass! This is due to the fact that no H's or L's appear, nothing is tested, and thus nothing fails.

In order to send a JEDEC file from the logic array programmer 40 to a remote computer, once an array pattern is in the RAM memory 4, it can be sent out via the serial port 30 to a remote host computer (not shown). The transmission parameters for the serial port are fixed at the same values as for receiving data: 9600 baud, no parity, 8 data bits, 1 stop bit.

The receiving end must be capable of receiving serial data at 9600 baud with no handshake signals. An IBM PC BASICA program for receiving and printing this data is shown in the following Table D:

TABLE D

| A BASICA Program for Receiving a JEDEC File From The Logic Array Programmer | |
|---|---|
| 100 OPEN "com1:9600,n,8" AS #1 | ; open the serial port |
| 102 PRINT:PRINT | |
| 120 A$=INPUT$(1,#1) | ; get one character |
| 130 IF ASC(A$)=3 THEN 190 | ; check for ETX |
| 140 PRINT A$;:GOTO 120 | ; print it |
| 190 BEEP:PRINT:END | |

To run the above program, the operator must start BASIC with the following command:
basica /c:4096
This tells BASIC to set aside a 4 Kilobyte buffer for incoming data from the serial port. This also eliminates the need for handshake signals since the data is loaded at high speed into the buffer, and then processed at leisure by BASIC.

This buffering method works fine for most "modern" PC's. A 4.77 MHz 8088 based machine will lose characters with the above program. If this is the case, use a communications program to transfer error free data at 9600 baud. Once this program is loaded, simply type "RUN", or press F2, and then press SEND switch on the logic array programmer 40.

To print the fusemap, press [CTL-PrtSc] before typing RUN, or press F2, and make sure the printer is connected and on-line. The next two pages show a JEDEC file for a PAL12L6 that was transmitted to the logic array programmer 40 over the serial port.

After loading this file, the above basic program is run, and the following output starting is produced. This listing shows exactly how the 12L6 fuses were mapped into the larger GAL16V8.

Here is the PAL12L6 file that was transmitted to the logic array programmer 40:

```
ABEL(tm) Version 1.13 JEDEC file for: P12L6
Created on: 20-Sep-86 04:07 PM
Architecture Test Pattern
"GAL 12L6"
Lane Hauck*
QP20* QF384*
L0000
1010101110111111111111111
000000000000000000000000
000000000000000000000000
000000000000000000000000
110111111111111111111111
011111111111111111111111
111110111011111111111111
000000000000000000000000
111111111101111111111111
111111111110111111111111
111111111111101111111111
111111111111110111111111
111111111111111111111101
111111111111111111011111
111110111111111111111111
111111111111111111110111*
V0001 000000000N00HHHLHL0N*
V0002 100000000N00HHHLLH0N*
V0003 010000000N00HHHLLH0N*
V0004 001000000N00HHHHHH0N*
V0005 000100000N00HHHHHH0N*
V0006 000010000N00HHLLHL0N*
V0007 000001000N00HHLLHL0N*
V0008 000000100N00HLHLHL0N*
V0009 000000010N00HLHLHL0N*
V0010 000000001N00LHHLHL0N*
V0011 000000000N10LHHLHL0N*
V0012 000000000N01LHHLHL0N*
V0013 000000000N00LHHLHL1N*
CC22A0*
/\
  C39B
```

The following is a listing of the file sent back to the IBM PC after the BASIC program shown in this Table D is loaded and run, and the the logic array programmer 40 SEND switch is pressed. The bracketed numbers have been added for reference. The PAL12L6 fuses have been mapped into the much larger GAL16V8 device by the logic array programmer 40.

```
Jedec file from Qwerty Inc. logic array programmer
40 device.
Device: G16V8.
UES:    "GAL 12L6"*
L0000
0000000001100110011001100000000 [1]
0000000001100110011001100000000
0000000001100110011001100000000
0000000001100110011001100000000
0000000001100110011001100000000
0000000001100110011001100000000
0000000001100110011001100000000
0000000001100110011001100000000
1010101110111111111111111111111
0000000001100110011001100000000
0000000001100110011001100000000
0000000001100110011001100000000
0000000001100110011001100000000
0000000001100110011001100000000
0000000001100110011001100000000
0000000001100110011001100000000
1101111111111111111111111111111
0111111111111111111111111111111
0000000001100110011001100000000
0000000001100110011001100000000
0000000001100110011001100000000
0000000001100110011001100000000
0000000001100110011001100000000
0000000001100110011001100000000
1111101110111111111111111111111
0000000001100110011001100000000
0000000001100110011001100000000
0000000001100110011001100000000
0000000001100110011001100000000
0000000001100110011001100000000
0000000001100110011001100000000
1111111111101111111111111111111
1111111111111011111111111111111
0000000001100110011001100000000
0000000001100110011001100000000
0000000001100110011001100000000
0000000001100110011001100000000
0000000001100110011001100000000
0000000001100110011001100000000
1111111111111111101111111111111
1111111111111111111111101111111
0000000001100110011001100000000
0000000001100110011001100000000
0000000001100110011001100000000
0000000001100110011001100000000
0000000001100110011001100000000
0000000001100110011001100000000
1111111111111111111111111111101
1111111111111111111111111011111
1111101111111111111111111111111
1111111111111111111111111110111
0000000001100110011001100000000
0000000001100110011001100000000
0000000001100110011001100000000
0000000001100110011001100000000
0000000001100110011001100000000
0000000001100110011001100000000
0000000001100110011001100000000
0000000001100110011001100000000
0000000001100110011001100000000
0000000001100110011001100000000
00000000 [2]
01000111 01000001 01001100 00100000 ...
00110001 00110010 01001100 00110110 [3]
10000001 [4]
00000000 11110000 11000000 11000000 ...
11000000 11000000 11110000 00000000 [5]
10* [6]
C8563* [7]
```

The first 64 lines [1] represent the 64 product terms in the GAL16V8. Each product term has 32 fuses. The next 8 fuses [2] are the generic array logic XOR terms, from pin 19 to pin 12 reading from left to right. This is a PAL12L6 emulation, so all XOR fuses are 0, indicating active low outputs.

The next 64 fuses [3] represent the UES. The actual listing puts these eight bytes on one line. The UES is also shown in text form in the header transmitted by the logic array programmer 40. The next 8 fuses [4] are the generic array logic AC1 bits, from pin 19 to pin 12 reading from left to right. The next line of 64 fuses [5] represents the PTD fuses. The actual listing puts these eight bytes on one line.

The last two fuses [6] are the SYN and AC0 architecture bits. The "C8563*" is the fuse checksum. This corresponds to the "G$" checksum shown by the logic array programmer 40 display.

The fuse map transmitted over the serial port when the SEND switch 11 is depressed, includes the entire generic array logic fuse array, plus the architecture bits used to configure the generic array logic device. A typical dump is shown in Table D.

The Security Option

The GAL16V8 and GAL20V8 generic array logic devices have a security feature which prevents further programming or verification of the fuse array. A secured generic array logic device can be used again, but only doing a "bulk erase" which erases the entire array and security bit, thus returning the generic array logic device to it's "virgin" state. This is done automatically by the logic array programmer 40 whenever a generic array logic device is programmed.

The security feature is activated by including a special field in the JEDEC file. This field must be outside the JEDEC file header, and looks as follows: G1*

As an example, the following is the beginning of a JEDEC file for a PAL10L8 without security, followed by an edited version which adds security. The only difference is the inserted line 7.

| [1] | ABEL(tm) Version 1.13 JEDEC file for: P10L8 |
| [2] | Created on: 01-May-86 09:24 PM |
| [3] | Architecture Test Pattern |
| [4] | "GAL 10L8" |
| [5] | Lane Hauck* |
| [6] | QP20* QF320* |
| [7] | L0000 |
| [8] | 1011111111111111101 |
| . | 0000000000000000000 |
| . | 1101111111111111111 |
| Security Feature Added: | |
| [1] | ABEL(tm) Version 1.13 JEDEC file for: P10L8 |
| [2] | Created on: 01-May-86 09:24 PM |
| [3] | Architecture Test Pattern |
| [4] | "GAL 10L8" |
| [5] | Lane Hauck* |
| [6] | QP20* QF320* |
| [7] | G1*    ← (This line was added |
| [8] | L0000    with a word processor). |
| [9] | 1011111111111111101 |
| . | 0000000000000000000 |
| . | 1101111111111111111 |

The "G1*" tells the logic array programmer 40 to proceed as follows:

1. Program and verify the part in the usual way.
2. Program the security fuse. The following message is displayed:

Securing the Device.

The array cells of a secured generic array logic device cannot be read or verified. They actually read as all "1's". The UES and PC of a secured device are always available for display. Test vectors can be run on a secure device.

A generic array logic device contains 64 fuses that are reserved for to identify the generic array logic device. These fuses are called the User Electronic Signature (UES), and they are there for the sole purpose of storing anything the user wishes to put there. In order to add the user electronic signature to a JEDEC file, the operator merely uses a word processor to add an eight character (or less) message to the JEDEC file header, and to insert it between quotes, after the [stx] character, and before the first asterisk. An asterisk should not be inserted in the UES. The logic array programmer 40 interprets an asterisk as an end-of-field marker.

The following are two versions of a JEDEC file, first without the UES, and then with the UES added: Without the UES:

| [1] | ABEL(tm) Version 1.13 JEDEC file for: P10L8 |
| [2] | Created on: 01-May-86 09:24 PM |
| [3] | Architecture Test Pattern |
| [4] | Lane Hauck* |
| [5] | QP20* QF320* |
| [6] | L0000 |

| | -continued |
| --- | --- |
| [7] | 1011111111111111101 |
| . | 0000000000000000000 |
| . | 1101111111111111111 |
| . | 1111111111111111101 |
| [etc] | 1111101111111110111 |
| With the UES Added: | |
| [1] | ABEL(tm) Version 1.13 JEDEC file for: P10L8 |
| [2] | Created on: 01-May-86 09:24 PM |
| [3] | Architecture Test Pattern |
| [4] | "GAL 10L8"    ← (This line was added |
| [5] | Lane Hauck*    with a word processor). |
| [6] | QP20* QF320* |
| [7] | L0000 |
| [8] | 1011111111111111101 |
| . | 0000000000000000000 |
| . | 1101111111111111111 |
| . | 1111111111111111101 |
| [etc] | 1111101111111110111 |

The logic array programmer 40 checks for characters after the first quote, and stops looking when it finds either another quote or eight characters. Thus, a 5-character message is padded with three trailing spaces.

The UES can also be included in quotes in the logic compiler source file. Then when the design is compiled the eight character message appears in the JEDEC header. This step might take some experimentation with the compiler.

If an existing JEDEC file is edited to add the UES into the header, the "Transmission Checksum" of the file will change. The transmission checksum appears as the very last four hex digits of the JEDEC file.

Since the logic array programmer 40 does not use the transmission checksum, there are no adverse affects resulting from editing the JEDEC file and then loading it into the logic array programmer 40. But if it is desired to load the edited JEDEC file into another programmer, which does need the transmission checksum, the operator should, at the time the JEDEC header is edited, change the transmission checksum to 0000. This would inform any programmer to ignore the transmission checksum.

Considering now the UES override, the 64 UES fuses are assigned fuse addresses so that they can be referenced in a standard JEDEC file. These addresses are as follows:
GAL16V8: Fuses 2056 through 2119 (decimal)
GAL20V8: Fuses 2568 through 2631 (decimal)

Some logic compilers allow the operator to explicitly set fuses in the JEDEC file. For example, Version 2.02a of ABEL has a "FUSES" statement. If the UES information is contained in a JEDEC file in fuse form, it overrides a UES that was added to the JEDEC header with the method previously described above.

VLSI Technology generic array logic devices are capable of storing the number of erase-program cycles up to 9999. Lattice generic array logic devices that have been programmed more than 100 times indicate "PC>100" on the display panel 6. Consider the following example:

The logic array programmer 40 is turned on, and the Lattice mode is selected. A VLSI Technology part with an EPC (Extended Program Cycle count) of 1234 is plugged in, and LOAD DEVICE switch 9 is depressed. The cycle count shows as "PC>100". This is because the logic array programmer 40 has been set to the Lattice mode, which does not support an extended program cycle count.

To display the extended cycle count, the logic array programmer 40 is turned off and on, and the VLSI Technology mode is selected. Now pressing the LOAD DEVICE switch 9 will show, "EPCC=1234".

TROUBLESHOOTING

This section lists the error messages, their meaning and what to do about them.

Testing the RAM ...

RAM Error (Goodbye)

When the logic array programmer 40 is turned on, the internal 8K RAM 4 is tested. If an error results, the signoff message indicates that no further operation is possible until the RAM chip is replaced.

The memory chip is an 8 Kilobyte static RAM in "skinny-dip" (0.3 inch wide) package. Suitable replacements are Toshiba TC5563APL-15 and Hitachi HM6264ALSP-15.

[1] Sorry, unable to read this device.
[2] Can't PGM this part.

If one of the above messages is displayed, either no device is plugged in, or there is an internal generic array logic device error.

The logic array programmer 40 then tests for the presence of a correctly socketed generic array logic device by performing a device test. This involves shifting a test pattern into an internal generic array logic device shift register, shifting the data back out, and comparing the results.

This device test is run whenever either the LOAD DEVICE switch, VERIFY switch 10, or PROGRAM switch 8 is depressed. Message [1] appears if the error were detected for the LOAD DEVICE, or VERIFY operation. The read or verify operation is aborted. Message [2] appears if an error were detected for the PROGRAM operation. The program operation is aborted.

If any of these messages appear, the operator should ascertain that the generic array logic device is correctly socketed. If the error persists, try another generic array logic device is then tryed.

```
         Device is SECURED!!!
         "UsrE1Sig"      PC=03
```

The device has been secured and the array is unreadable. Note that even though the array fuses are secured, the UES ("UsrE1Sig") and program cycles ("PC=03") can still be read and are displayed. A generic array logic device is considered secured if all the array fuses read as "1's". There is no way to explicitly verify the state of the "security fuse". If a generic array logic device has all the array fuses set to 1, it will show as secure by the logic array programmer 40.

Jedec File Error:

... too large for RAM

The JEDEC file is loaded into a 7 kilobyte RAM for further processing. If the file is larger than this, the above error message will appear. The only way this can happen is if there are more than about 150 test vectors. The CANCEL switch 12 is pressed to clear this message. If this happens, the operator splits up a JEDEC file into more than one part. Each part contains a portion of the test vectors.

Jedec File Error:

no device type found

When a JEDEC file is loaded via the serial port 30, the file is first checked for errors. This message indicates that no device type is present in the file header. Table A lists the device types that the logic array programmer 40 accepts. If the JEDEC file does not include the device type in its header, it could be easily added by editing the file with a word processor. It could be inserted in the header between the first character of the file ([stx]) and the first asterisk. The transmission checksum at the end of the JEDEC file must be set to 0000.

Jedec File Error:

non 0 or 1 in fuses

The logic array programmer 40 requires that all characters between the "Lnnnn" field and the terminating asterisk be either "0" or "1". If this is not the case, the above message will appear.

Jedec File Error:

Non-digit after "L"

The "L" field must be in the form "L1234", with decimal digits, and no spaces between the "L" and the digits. If this is not the case, the above message will appear.

Jedec File Error:

... Can't find Cnnnn

The fuse checksum is missing from the JEDEC file. This message is displayed for about a second, and then the "nnnn" is filled in with the computed JEDEC file checksum. Even though the fuse checksum is missing, the logic array programmer 40 can be operated normally.

The missing checksum for the received fuse data is computed and shown for convenience. A word processor can be used to add the displayed checksum to the JEDEC file and avoid future similar error indications.

[1] Non-VLSI Tech Device
[2] Non-Lattice Device

If the logic array programmer 40 is in "VLSI Tech" mode, and an attempt is made to program a Lattice generic array logic device, message [1] appears. If the logic array programmer 40 is operating in "Lattice" mode, and an attempt is made to program a VLSI Tech, generic array logic device, the message [2] will appear. At this stage, the operator could either use the proper manufacturer's device, or turn the logic array programmer 40 off and on again, and select the correct manufacturer.

... PROGRAMMING ...

Verify ERROR

After a program cycle, the fuses did not read back exactly as they were programmed. The generic array logic device or the logic array programmer 40 may have malfunctioned. The operator should then try a new generic array logic device. The operator may want to press the READ DEVICE, then the SEND switch 11 transmits the program array pattern to the personal computer (not shown). Investigation of the actual fuses might lead to the cause of the problem.

```
----- PS---- GS---

------------ PC = 00
```

If a new generic array logic device is loaded, and the LOAD DEVICE 9 is depressed, the above message appears. The device has never been programmed (PC=0), so the usual information is meaningless and is shown as dashed lines. Of course, there is nothing wrong here. The new generic array logic device requires to be simply programmed.

The logic array programmer 40 eliminates the need for entering "device codes" by reading the programmable array logic device type from the JEDEC header or by determining it from the generic array logic device fuses. When a generic array logic device is loaded into the logic array programmer 40, the fuse patterns are examined, and if an equivalent programmable array logic architecture is found to match the generic array logic fuse patterns, this programmable array logic device type is displayed.

In certain cases the generic array logic device type "changes". This can happen if a generic array logic device has programmable output polarities, and all polarity fuses are set high or low. For example, a P16L8 and a P16P8 have architectures that differ only in the output polarity fuses (XORS). The P16L8 has output polarity fuses fixed at 00000000. All outputs are fixed to be active low.

The P16P8, on the other hand, has an arbitrary output polarity fuses design. If this device happens to be set at 00000000, the device is indistinguishable from a P16L8. In this case the generic array logic device type is shown as a P16L8 by the logic array programmer 40.

This indicates that the P16P8 design would also fit into the fixed polarity (and cheaper) P16L8 device. All fuses, checksums and test vectors are unaffected by this phenomenon, so there is no harm caused by this slight side effect.

The following table shows the device types that can appear to change.

| | | |
|---|---|---|
| 10P8 | 0 | 10L8 |
| 10P8 | 1 | 10H8 |
| 12P6 | 0 | 12L6 |
| 12P6 | 1 | 12H6 |
| 14P4 | 0 | 14L4 |
| 14P4 | 1 | 14H4 |
| 16P2 | 0 | 16L2 |
| 16P2 | 1 | 16H2 |
| 16RP4 | 0 | 16R4 |
| 16RP6 | 0 | 16R6 |
| 16RP8 | 0 | 16R8 |
| 14P8 | 0 | 14L8 |
| 14P8 | 1 | 14H8 |
| 16P6 | 0 | 16L6 |
| 16P6 | 1 | 16H6 |
| 18P4 | 0 | 18L4 |
| 18P4 | 1 | 18H4 |
| 20P2 | 0 | 20L2 |
| 20P2 | 1 | 20H2 |
| 20RP4 | 0 | 20R4 |
| 20RP6 | 0 | 20R6 |

-continued

| | | |
|---|---|---|
| 20RP8 | 0 | 20R8 |

COMPUTER SOFTWARE

Considering now the logic array programmer 40, with respect to FIG. 3, the power is first turned on at 45. As indicated at 47 a copyright message will then automatically appear on the LCD display 6. Following the copyright message, the manufacturer's name is then displayed on the display 6, at 49. As indicated at 50, the software determines whether the PROGRAM button 8 has been pressed. If it has, then as indicated at 52, the manufacturer's name is changed, and the new manufacturer's name will be displayed at 49.

If the PROGRAM button 8 was not depressed, then as indicated at 54, the software determines whether there is any other button which was pressed. If it was not, the software determines once again whether the PROGRAM button 8 was pressed at 50. If on the other hand any other button was pressed, then, as indicated at 56, the software will determine whether there is any UART Data. If it is then the READ SERIAL routine is executed at 58, as will be discussed later in greater detail, with respect to FIG. 4, and the software once again determines whether there is any UART Data available at 56.

If UART Data is not available, then the software determines whether the PROGRAM button 8 is down, at 60. If the PROGRAM button 8 was down, then the PROGRAM DEVICE routine is executed at 62, as will be described later in further detail with respect to FIG. 5. The software then determines once again whether there is any UART Data available at 56, and whether the PROGRAM button is up at 60.

If on the other hand the PROGRAM button 8 was up, the software determines whether the LOAD button 9 is down, at 64. If it is then the LOAD DEVICE routine is executed at 66, as will be discussed later in further detail with respect to FIG. 6. The software then determines once again whether there is any UART Data available at 56, whether the PROGRAM button is up at 60, and whether the LOAD button 9 is up at 64.

If the LOAD button 64 is up, then the software determines whether the VERIFY button is down. If it is, then the VERIFY routine is executed at 70, as will be discussed later in greater detail with respect to FIG. 7. The software then determines once again whether there is any UART Data available at 56, whether the PROGRAM button is up at 60, whether the LOAD button is up at 64, and whether the VERIFY button is up at 68.

If the VERIFY button is up, then the software determines whether the SEND button is down, at 72. If it is then the SEND SERIAL routine is executed, as will be described later in greater detail with respect to FIG. 8, at 74. The software then once again determines whether there is any UART Data available at 56, whether the PROGRAM button is up at 60, whether the LOAD button is up at 64, whether the VERIFY button is up at 68, and whether the SEND button is up at 72.

If the SEND button is up, the software loops back to the decision bar 56.

Figure 4:
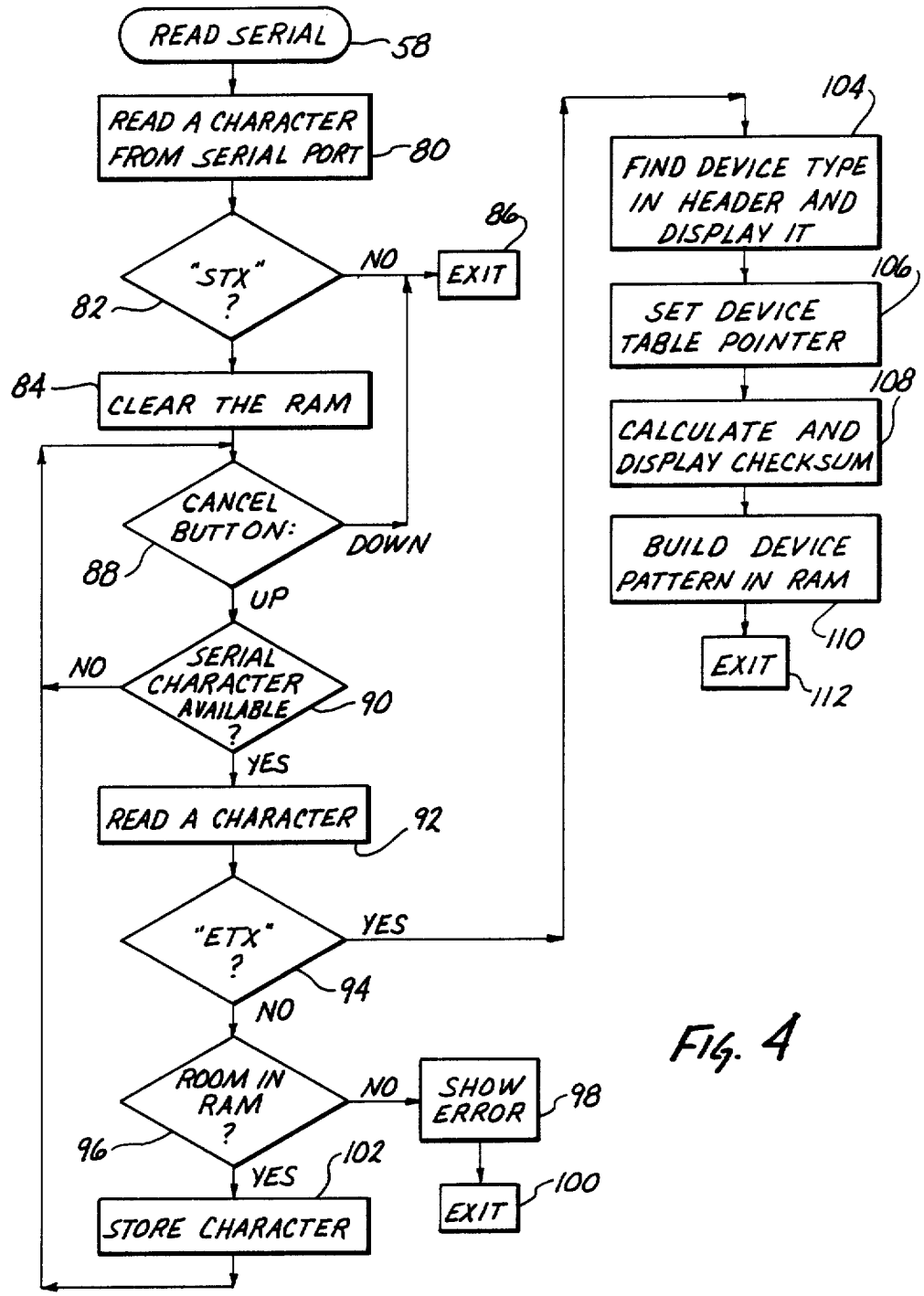
FIGS. 4–8 are detailed flowcharts of each of the subroutine computer software programs shown in FIG. 3, as executed by the logic array programmer of FIG. 1.

Considering now the READ SERIAL routine with respect to FIG. 4. The READ SERIAL routine commences at 58 with the reading of a character from the serial port 30, at 80.

As indicated at 82, the software then determines the existence of an "STX" character. The "STX" indicates the start of the transmission, and has an ASCII code of 02. It is the first valid character of a JEDEC file. If no "STX" character is detected, the READ SERIAL routine is terminated, as indicated at 86.

As indicated at 84, if an "STX" character is detected, the RAM 4 is cleared. The software then determines whether the CANCEL button 12 is down, at 88.

If the CANCEL button is down, the READ SERIAL routine is terminated, as indicated at 86. If however the CANCEL button 12 is up, the software determines whether a serial character is available, at 90. If a serial character is not available, then the software determines once again whether the CANCEL button 12 is up, at 88. If the serial character is available, the character is read at 92, and the software determines whether an "ETX" character is available at 94. The "ETX" character indicates the end of the transmission, and has an ASCII code of 03.

If an "ETX" signal is detected, and is indicated at 104, the device type is found in the header and displayed.

As indicated at 106, the device table pointer is set. This pointer establishes the type of the programmable array logic or generic array logic for all subsequent operations.

As indicated at 108, the checksum is then calculated and displayed. The device pattern is then built in the RAM 4, at 110. The READ SERIAL routine is then terminated at 112.

If an "ETX" character is not detected, the software determines whether there is sufficient memory in the RAM 4, at 96. If there is not sufficient memory in the RAM 4, the error is indicated at 98, and the READ SERIAL routine is terminated at 100.

As indicated at 102, if there is sufficient memory in the RAM 4, the character is stored therein, and the software exits back to the step of deciding whether the CANCEL button 12 is up, at 88.

Figure 5:
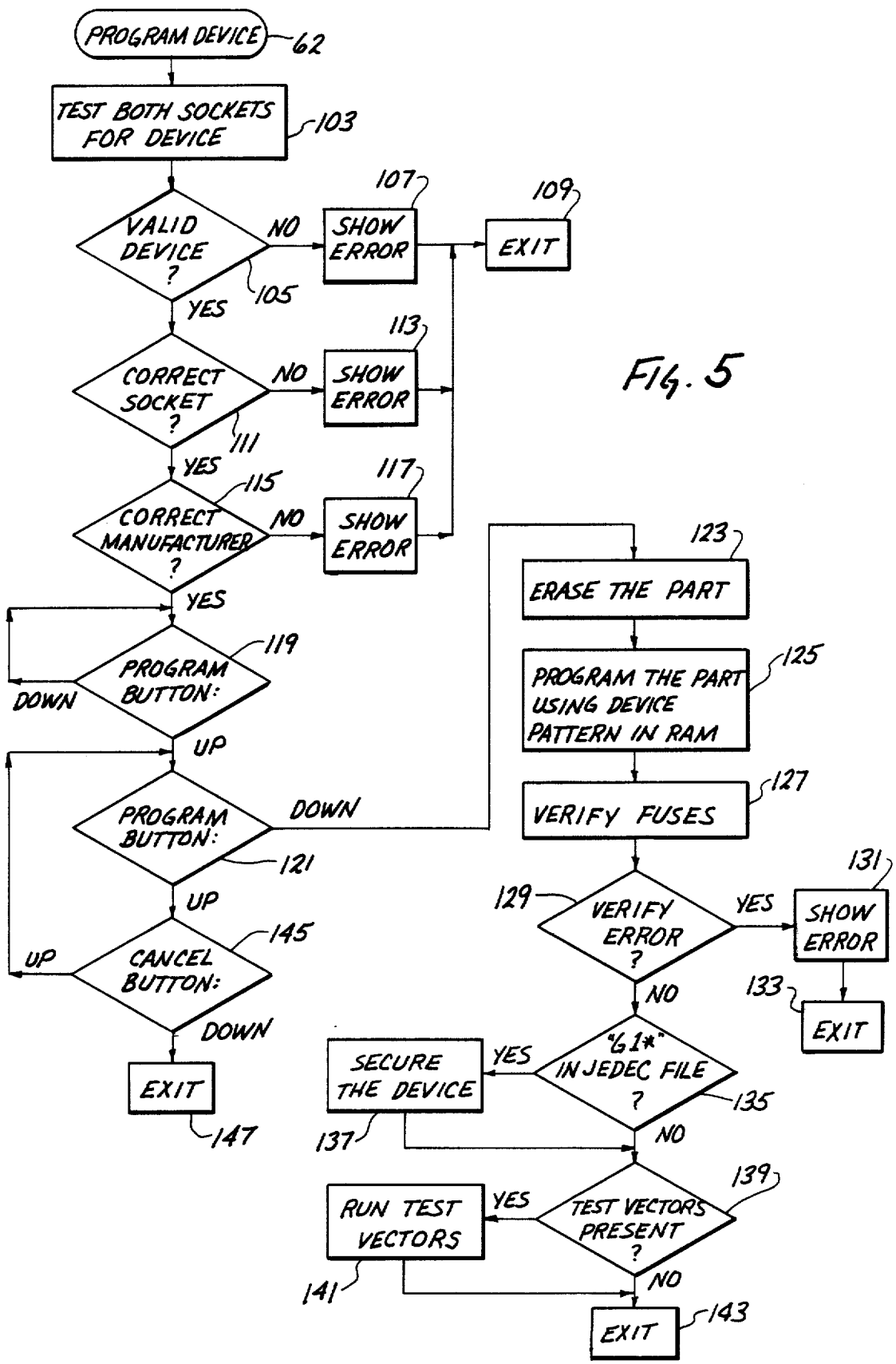

Considering now the PROGRAM DEVICE routine with respect to FIG. 5. As indicated at 62, the PROGRAM DEVICE routine starts with the testing of both sockets 19 and 20 for the proper generic array logic device, at 103. The software then determines whether the inserted generic array logic device is valid, at 105.

If the generic array logic device is invalid, an error is displayed on the LCD display 6, at 107, and the PROGRAM DEVICE routine is terminated, as indicated at 109.

If however the generic array logic device is valid, the software determines whether the receiving socket 19 or 20 is the correct socket choice, at 111. If the receiving socket is not correct, an error is displayed on the LCD display 6, at 113, and the PROGRAM DEVICE routine is terminated, as indicated at 109.

As indicated at 115, if the socket choice is correct, the software determines whether the manufacturer's choice is correct. If the manufacturer's choice is incorrect, then, as indicated at 117, an error is displayed on the LCD display 6, and the socket PROGRAM DEVICE routine is terminated as indicated at 109.

If on the other hand the manufacturer's choice is correct, the software determines whether the PROGRAM button 8 is down, at 119. The PROGRAM button 8 must be pressed down twice before the programming of the generic array logic device proceeds.

If the PROGRAM button 8 is down, the generic array logic device is erased, as indicated at 123.

As indicated at 125, the generic array logic device is then programmed using the device pattern in the RAM 4. The fuses are then verified, as indicated at 127.

As indicated at 129, the software then determines if there is a verify error. If there is a verify error, then it is displayed on the LCD display 6, as indicated at 131, and the PROGRAM DEVICE routine is terminated as indicated at 133.

As indicated at 135, if there is no verify error, the software determines whether a "G1*" indication exists in the JEDEC file. If the "G1*" indication exists, the generic array logic device is secured, as indicated at 137, and the software then determines whether there are any test vectors present, as indicated at 139.

If the "G1*" indication does not exist in the JEDEC file, then the software determines whether there are any test vectors present, as indicated at 139.

If there are any test vectors present, then the test vectors are run, as indicated at 141, and the PROGRAM DEVICE routine is then terminated as indicated at 143. If the test vectors is not present, then the PROGRAM DEVICE routine is terminated as indicated at 143.

As indicated at 145, if the PROGRAM button 8 is up, the software determines whether the CANCEL button 12 is up. If the CANCEL button 12 is up, then the software once again determines whether the PROGRAM button 8 is up, at 121, and then whether the CANCEL button is up at 145.

If the CANCEL button 12 is down, then the PROGRAM DEVICE routine is terminated, as indicated at 147.

Figure 6:
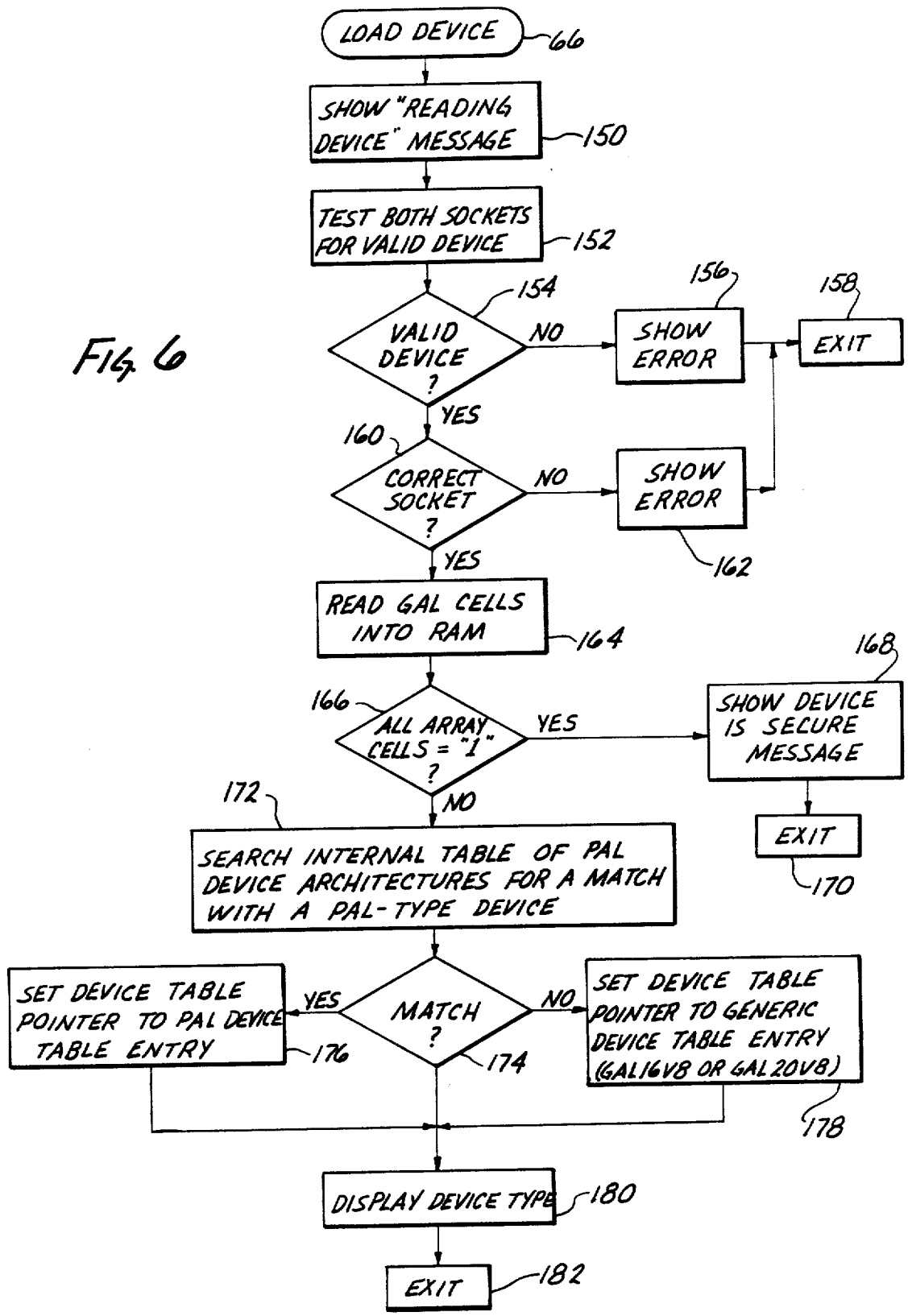

Considering the LOAD DEVICE routine in greater detail, with respect to FIG. 6. As indicated at 66, the LOAD DEVICE routine commences with the display of the "READING DEVICE" message on the LCD display 6, at 150.

As indicated at 152, both sockets 19 and 20 are then tested for the validity of the generic array logic device inserted therein. The software then determines whether the generic array logic device is valid, at 154. If the generic array logic device is not valid, then, as indicated at 156, the error is displayed on the LCD display 6, and the LOAD DEVICE routine is terminated, as indicated at 158.

As indicated at 160, if the generic array logic device is valid, then the software determines whether the socket choice was correct. If the socket choice was not correct, then as indicated at 162, an error message is displayed on the LCD display 6, and the LOAD DEVICE routine is terminated as indicated at 158.

If however the socket choice is correct, then as indicated at 164, the generic array logic cells are read into the RAM 4. Then, as indicated at 166, the software determines whether all the array cells are "1's". If all the array cells are "1's", then as indicated at 168, a "DEVICE IS SECURED" message is displayed on the LCD display 6 at 168, and the LOAD DEVICE routine is terminated at 170.

If all the array cells are not "1's", then, as indicated at 172, the internal table of the programmable array logic device architectures is searched for a match with a programmable array logic type device. The software then determines whether a match has occurred, as indicated at 174.

If a match has occurred, then the device table pointer is set to the programmable array logic device table entry, as indicated at 176. Subsequently the type of the device is displayed, as indicated at 180.

If on the other hand a match has not occurred, as indicated at 174, the device table pointer to generic device table entry (GAL16V8 or GAL20V8) is set, as indicated at 178. The type of the device is that displayed as indicated at 180, and the LOAD DEVICE routine is terminated at 182.

Figure 7:
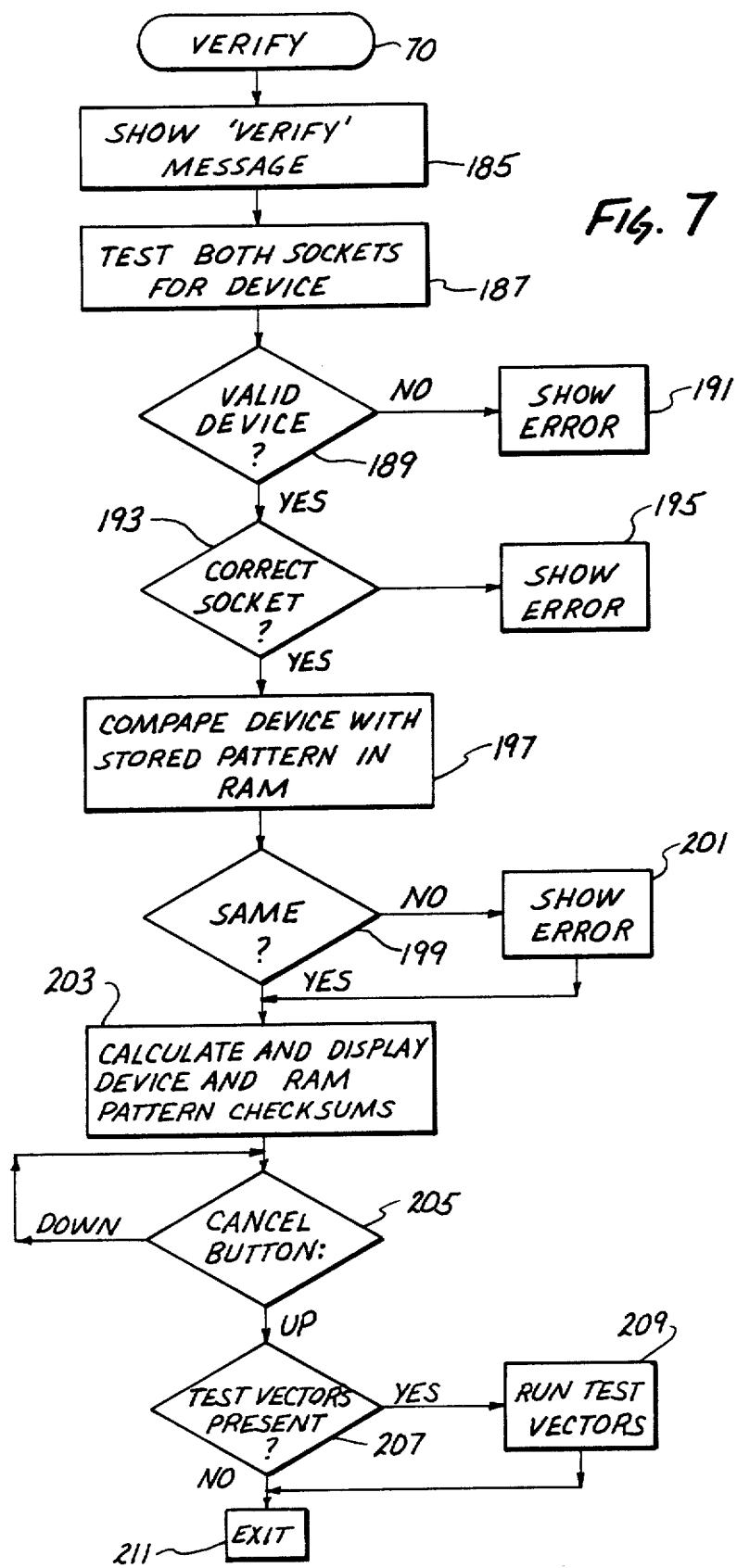

Considering now the VERIFY routine in greater detail with respect to FIG. 7. As indicated at 70, the VERIFY routine commences at 70 by displaying the "VERIFY" message on the LCD display 6, as indicated at 185.

The sockets 19 and 20, are then tested for the validity of the generic array logic device inserted therein, as indicated at 187. As indicated at 189 the software then determines whether the generic array logic device is valid. If it is not, then an error message is displayed on the LCD display 6, as indicated at 191, and the software exits.

As indicated at 193, if the inserted generic array logic device is valid, then the socket type is tested. If the socket used is incorrect, then an error message is displayed on the LCD display 6, as indicated at 195, and the software exits.

As indicated at 197, the generic array logic device is then compared with a stored pattern enter RAM 4. The software then determines whether a match occurs, as indicated at 199. If a match does not occur, then an error message is displayed on the LCD display 6, as indicated at 201, and the checksums of the generic array logic device and RAM pattern are calculated and displayed as indicated at 203.

If as indicated at 199 a match occurs, then the checksums of the generic array logic device and the RAM pattern are calculated and displayed on the LCD display 6, at 203.

As indicated at 205, the software determines whether the CANCEL button 12 is down. If the CANCEL button 12 is down, then the software decides once again whether the CANCEL button 12 is down, as indicated at 205.

If the CANCEL button 12 is up, then the software determines whether the test vectors are present, as indicated at 207. If the test vectors are present, then the test vectors are run, as indicated at 209, and the VERIFY routine is displayed on the LCD display 6 as indicated at 211. If on the other hand the test vectors are not present, then the VERIFY routine is terminated automatically, as indicated at 211.

Figure 8:
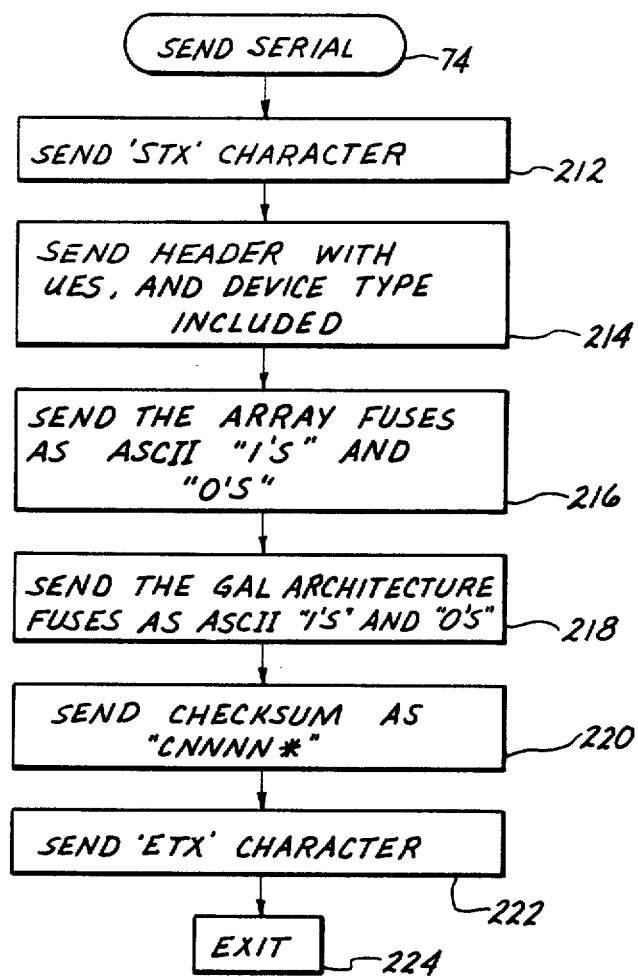

Considering now the SEND SERIAL routine in greater detail, with respect to FIG. 8. As indicated at 74, the SEND SERIAL routine commences with the sending of the "STX" character to a computer (not shown), at 212. The "STX" character indicates the start of the transmission and has an ASCII code of 02.

As indicated at 214, the header and the User Electronic Signature are sent to the computer, including the type of the generic array logic device.

As indicated at 216, the array fuses is then sent as ASCII "1's" and "0's".

As indicated at 218, the generic array logic architecture fuses are then sent as ASCII "1's" and "0's", and is followed by the checksum at 220.

As indicated at 222, the "ETX" character is then sent as an indication of the end of the transmission. The "ETX" character has an ASCII code of 03. The SEND SERIAL routine is then terminated as indicated at 224.

While particular embodiments of the present invention have been disclosed, it is to be understood that various different modifications are possible and are contemplated within the true spirit and scope of the appended claims. There is no intention, therefore, of limitations to the exact abstract o disclosure herein presented.

What is claimed is:

1. A logic array programmer for programming a generic array logic device corresponding to logic array file information for a certain array logic device, the information including given array logic design file information determining a given fuse pattern, and a device code information identifying a given type of logic array device, comprising:
   volatile memory means;
   means for storing signals indicative of the logic array file information in said volatile memory means;
   means for reading signals indicative of said given array logic device code information;
   permanent memory means for storing signals indicative of device code conversion table information;
   table look-up means for receiving said signals indicative of the array logic device code information for the generic array logic device to be programmed, corresponding to the read array logic device code information;
   means responsive to the received signals for converting said given array logic design file information into generic array logic design file information signals for the generic array logic device to be programmed; and
   means responsive to the last-mentioned means for programming the generic array logic device with said converted logic design file information signals.

2. A logic array programmer for programming a generic array logic device corresponding to logic array file information for a certain array logic device, the information including given array logic design file information determining a given type of logic array device, comprising:
   volatile memory means;
   means for storing said signals indicative of the logic array file information in said volatile memory means;
   means for reading signals indicative of said given array logic design file information;
   input means to cause, in response to the single activation thereof the reading means to read said signals indicative of said given array logic design file information, and the storing means to store said signals in said volatile memory means when read by said reading means; and
   programming means for transferring said array logic design file information stored in said volatile memory meane from said volatile memory means to the generic array logic device for programming it.

3. A logic array programmer according to claim 1, further including:
   means for storing signals indicative of a generic array logic design file information, including given device code information in said volatile memory means;
   means for reading signals indicative of said generic array logic design file information; and input means to cause, in response to the single activation thereof the reading means to read said signals indicative of said array logic design file information, and the storing means to store said signals in said volatile memory means when read by said reading means.

4. A logic array programmer according to claim 3, further including:
programming means for transferring said array logic design file information stored in said volatile memory means from said volatile memory means to generic array logic device to be programmed.

5. A logic array programmer according to claim 1, further including:
a message display for indicating device codes.

6. A logic array programmer according to claim 1, further including:
socket means for receiving said generic array logic device to be read or programmed; and
means for detecting missocketing of said generic array logic device.

7. A logic array programmer according to claim 5, wherein:
said file information includes test vectors information.

8. A logic array programmer according to claim 7, wherein:
said message display indicates said test vectors information, in response to a single activation of a single input device.

9. A logic array programmer according to claim 8, wherein:
said message display indicates an error or mismatch in said test vectors.

10. A logic array programmer according to claim 1, further comprising:
means for adding signals indicative of unique identification information for said programmable array logic device.

11. A logic array programmer according to claim 10, wherein:
said signals indicative of unique identification information are stored in said volatile memory means, and are programmed in the generic array logic device.

12. A logic array programmer according to claim 11, further including:
a message display for indicating said signals indicative of said unique identification information.

13. A logic array programmer according to claim 1, further comprising:
port means for receiving said signals indicative of the programmable array logic design file information; and
means for continuously scanning port means to detect the receipt of said signals indicative of the programmable array logic design file information.

14. A logic array programmer according to claim 13, wherein:
said port means is a serial port for connection to a remote computer system.

15. A logic array programmer according to claim 6, wherein:
said socket means comprises a pair of sockets.

16. A logic array programmer according to claim 15, further comprising:
visual means indicative of the socket to be used for receiving the generic array logic device.

17. A method of programming a generic array logic device corresponding to logic array file information for a certain array logic device, the information including given array logic design file information determining a given fuse pattern, and a device code information identifying a given type of logic device, comprising:
storing signals indicative of the logic array file information in a volatile memory means;
reading signals indicative of said given array logic device code information;
storing signals indicative of device code conversion table information in a permanent memory means;
receiving said signals indicative of the array logic device code information for the generic array logic device to be programmed, corresponding to the lead array logic device code information;
converting said given array logic design file information into generic array logic design file information signals for the generic array logic device to be programmed; and
programming the generic array logic device with said converted logic design file information signals.

18. A method according to claim 17, further including:
indicating device codes.

19. A method of programming a generic array logic device corresponding to logic array file information for a certain array logic device, the information including given array logic design file information determining a given fuse pattern, and a device code information identifying a given type of logic array device, comprising:
storing said signals indicative of the logic array file information in a volatile memory means;
reading signals from a generic array logic device to be programmed, indicative of said signals being a given generic array logic device code information;
actuating, by a single actuation, a user-actuable input device, to cause a reading means to read said signals indicative of said given array logic design file information, and to cause a storing means to store said read signals in the volatile memory means when read by said reading means; and
transferring said array logic design file information stored in the volatile memory means from said volatile memory means to the generic array logic device for programming it.

20. A method of programming a generic array logic device corresponding to logic array file information for a certain array logic device, the information including given array logic design file information determining a given fuse pattern, and a device code information identifying a given type of logic array device, comprising:
storing signals indicative of the logic array file information in volatile memory means;
reading signals indicative of said given array logic device code information;
storing signals indicative of device code conversion table information in permanent memory means;
receiving said signals indicative of the array logic device code information for the generic array logic device to be programmed, corresponding to the read array logic device code;
converting said given array logic design file information into generic array logic design file information signals for the generic array logic device to be programmed;

responding to said converted signals for programming the generic array logic device with said converted logic design file information signals;

storing signals indicative of a given array logic design file information, including given device code information in volatile memory means;

reading signals indicative of said generic array logic design file information;

reading said signals indicative of said array logic design file information, and storing said signals in the volatile memory means when read.

* * * * *

UNITED STATES PATENT AND TRADEMARK OFFICE
CERTIFICATE OF CORRECTION

PATENT NO. : 4,849,928

DATED : July 18, 1989

INVENTOR(S) : Lane T. Hauck

It is certified that error appears in the above-identified patent and that said Letters Patent is hereby corrected as shown below:

Column 7, line 49, after "pin 3", delete "f", and substitute therefor --of--.

Column 13, line 25, after "verify", delete "sWitch", and substitute therefor --switch--.

Column 19, line 12, after "line 7", on the next line, insert the following heading --Original JEDEC File:--

Column 28, line 8, after "abstract", please delete "o", and substitute therefor --or--.

Column 28, line 59, after "memory" delete "meane", and substitute therefor --means--.

Signed and Sealed this

Twenty-fourth Day of July, 1990

Attest:

HARRY F. MANBECK, JR.

*Attesting Officer*       *Commissioner of Patents and Trademarks*